United States Patent
Lee et al.

(10) Patent No.: US 9,361,974 B2
(45) Date of Patent: Jun. 7, 2016

(54) RESISTIVE MEMORY DEVICE AND METHOD OF OPERATING THE SAME TO REDUCE LEAKAGE CURRENT

(71) Applicant: SAMSUNG ELECTRONICS CO., LTD., Suwon-Si, Gyeonggi-Do (KR)

(72) Inventors: Yong-Kyu Lee, Hwaseong-Si (KR); Dae-Seok Byeon, Seongnam-Si (KR); Yeong-Taek Lee, Seoul (KR); Chi-Weon Yoon, Seoul (KR); Hyun-Kook Park, Anyang-Si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/683,269

(22) Filed: Apr. 10, 2015

(65) Prior Publication Data
US 2016/0093376 A1    Mar. 31, 2016

(30) Foreign Application Priority Data
Sep. 29, 2014    (KR) .................. 10-2014-0130333

(51) Int. Cl.
*G11C 11/00*    (2006.01)
*G11C 13/00*    (2006.01)

(52) U.S. Cl.
CPC .......... *G11C 13/0023* (2013.01); *G11C 13/004* (2013.01); *G11C 13/0069* (2013.01)

(58) Field of Classification Search
CPC ...................................... G11C 11/00
USPC ............. 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS

| | | | |
|---|---|---|---|
| 7,304,888 B2 | 12/2007 | Knall | |
| 7,606,086 B2 | 10/2009 | Inoue | |
| 7,688,614 B2 | 3/2010 | Morimoto | |
| 7,697,317 B2 | 4/2010 | Shimaoka et al. | |
| 8,665,634 B2 | 3/2014 | Minemura et al. | |
| 8,686,476 B2 | 4/2014 | Yang et al. | |
| 8,687,406 B2 | 4/2014 | Toda | |
| 2012/0014166 A1* | 1/2012 | Ma ..................... | G11C 13/0038 365/148 |
| 2012/0243294 A1 | 9/2012 | Kaneko et al. | |
| 2013/0148406 A1* | 6/2013 | Shimakawa ....... | G11C 11/1673 365/148 |
| 2013/0229852 A1 | 9/2013 | Kanno et al. | |
| 2013/0229853 A1 | 9/2013 | Minemura et al. | |
| 2014/0185360 A1* | 7/2014 | Kawai ............... | G11C 13/0007 365/148 |

* cited by examiner

*Primary Examiner* — Harry W Byrne
(74) *Attorney, Agent, or Firm* — Volentine & Whitt, PLLC

(57) ABSTRACT

A method of operating a memory device includes determining a value of an operating current flowing through a selected first signal line, to which a selection voltage is applied, from among a plurality of first signal lines; dividing an array of memory cells into n blocks, n being an integer greater than 1, based on the value of the operating current; and applying inhibit voltages having different voltage levels corresponding to the n blocks to unselected ones of second signal lines included in the n blocks. Each of the unselected second signal lines is a pathway through which leakage current may potentially flow due to the operating current flowing through the selected first signal line and a memory cell addressed by the unselected second signal line and the selected first signal line.

20 Claims, 21 Drawing Sheets

EL1  DS  EL2

RESISTIVE MEMORY DEVICE AND METHOD OF OPERATING THE SAME TO REDUCE LEAKAGE CURRENT

CROSS-REFERENCE TO RELATED APPLICATIONS

This application claims the benefit of Korean Patent Application No. 10-2014-0130333, filed on Sep. 29, 2014, in the Korean Intellectual Property Office, the disclosure of which is incorporated herein in its entirety by reference.

BACKGROUND

The application relates to a memory device, and more particularly, to a resistive memory device and a method of operating the resistive memory device.

As the demand for high capacity and low power consumption memory devices has increased, research into next-generation memory devices, such as non-volatile memory devices that do not require a refresh operation, has been actively conducted. These next-generation memory devices are required to have a high integrity characteristic like Dynamic Random Access Memory (DRAM), a non-volatile characteristic like flash memory, and high speed like static RAM (SRAM). Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) have been highlighted as some of the next-generation memory devices.

SUMMARY

The application provides a method of operating a memory device, which may reduce leakage current in unselected memory cells during writing or reading operation performed on the memory device.

The application provides a memory device capable of reducing leakage current in unselected memory cells during writing or reading operation.

According to an aspect of the application, there is provided a method of operating a memory device including a plurality of memory cells arranged on regions where a plurality of first signal lines and a plurality of second signal lines cross each other, the method including determining a value of an operating current flowing through a selected first signal line, to which a selection voltage is applied, from among the plurality of first signal lines; dividing a memory cell array comprising the plurality of memory cells into n blocks, n being an integer greater than 1, based on the value of the operating current; and applying inhibit voltages having different voltage levels corresponding to the n blocks to unselected ones of the second signal lines included in the n blocks. Each of the unselected second signal lines is a pathway through which leakage current may potentially flow due to the operating current flowing through the selected first signal line and a memory cell addressed by the unselected second signal line and the selected first signal line.

The dividing of the memory cell array into the n blocks may include determining a value of n based on the value of the operating current.

The dividing of the memory cell array into the n blocks may be characterized by increasing the value of n when the value of the operating current increases.

The method may further include setting numbers of blocks, each number of blocks corresponding to a range of operating currents. The dividing of the memory cell array into the n blocks may include selecting the value of n from among the numbers of the blocks set in advance, based on the value of the operating current.

The determining of the value of the operating current is based on the number of selected memory cells, from among the plurality of memory cells, connected to the selected first signal line when a writing operation is performed.

The determining of the value of the operating current is based on the number of programming loops for which a pulse is applied to the selected first signal line when a writing operation is performed.

The applying of the inhibit voltages may include applying an inhibit voltage having a relatively high voltage level among the inhibit voltages to a block located relatively close to at least one point to which the selection voltage is applied, from among the n blocks.

The applying of the inhibit voltages may include setting the voltage differences between the inhibit voltages based on the value of the operating current.

The selection voltage may be one of a write voltage and a read voltage.

The memory device may include a plurality of tiles, each comprising some of the plurality of memory cells, and the determining of the operating current and the dividing of the memory cell array into the n blocks may be performed with respect to each of the plurality of tiles.

According to another aspect of the application, there is provided a method of operating a memory device including a plurality of memory cells arranged on regions where a plurality of first signal lines and a plurality of second signal lines cross each other, the method including determining a value of an operating current flowing through a selected first signal line, to which a selection voltage is applied, from among the plurality of first signal lines; and generating a plurality of inhibit voltages, wherein voltage differences between the plurality of inhibit voltages are adjusted based on the value of the operating current; and applying the plurality of inhibit voltages to unselected second signal lines from among the plurality of second signal lines. Each of the unselected second signal lines is a pathway through which leakage current may potentially flow due to the operating current flowing through the selected first signal line and a memory cell addressed by the unselected second signal line and the selected first signal line.

The generating of the plurality of inhibit voltages may include increasing the voltage differences between the plurality of inhibit voltages when the value of the operating current increases.

The applying of the plurality of inhibit voltages may include dividing the second signal lines into a plurality of groups according to distances from at least one point, to which the selection voltage is applied, on the selected first signal line, and applying an inhibit voltage having a relatively high voltage level to a group that is close to the at least one point from among the plurality of groups.

The voltage differences between the plurality of inhibit voltages in a group may be constant.

The determining of the operating current may include determining the value of the operating current according to an operation mode of the memory device.

According to yet another aspect of the application, there is provided a method of operating a memory device comprising an array of memory cells that are addressed by a plurality of first and second signal lines. The method includes dividing the array of memory cells into n blocks of memory cells based on an indicator of the amount of operating current to be applied to a selected one of the first signal lines. For each of the n blocks of memory cells, an inhibit voltage is applied to each unselected one of the second signal lines addressing a memory cell within the block of memory cells. A different inhibit voltage is applied to each of two or more of the n blocks of memory cells. Each of the unselected second signal lines is a pathway through which leakage current may potentially flow due to the operating current flowing through the selected first signal line and a memory cell addressed by the unselected second signal line and the selected first signal line.

The different inhibit voltages applied to each of the two or more blocks of memory cells are selected so as to reduce the difference between a leakage current flowing through a first memory cell of one of the two or more memory cell blocks and a leakage current flowing through a second memory cell of another of the two or more memory cell blocks. The first memory cell is addressed by the selected first signal line and an unselected second signal line to which a first inhibit voltage is applied for the one memory cell block. The second memory cell is addressed by the selected first signal line and an unselected second signal line to which a second inhibit voltage is applied for the other memory cell block.

The different inhibit voltages applied to the two or more blocks of memory cells are selected based on a first voltage expected to be applied by the selected first signal line to a first memory cell of one of the two or more memory cell blocks and a second voltage expected to be applied by the selected first signal line to a second memory cell of another of the two or more memory cell blocks. The first memory cell is addressed by the selected first signal line and an unselected second signal line to which a first inhibit voltage is applied for the one memory cell block. The second memory cell is addressed by the selected first signal line and an unselected second signal line to which a second inhibit voltage is applied for the other memory cell block.

According to yet another aspect of the application, there is provided a memory device having an array of memory cells addressed by a plurality of first signal lines and a plurality of second signal lines, each of the memory cells being addressed by one of the first signal lines and one of the second signal lines. Control logic divides the array of memory cells into n blocks of memory cells based on an indicator of the amount of operating current to be applied to a selected one of the first signal lines. A first switch block applies the operating current to the selected first signal line. A second switch block applies, for each of the n blocks of memory cells, an inhibit voltage to each unselected ones of the second signal lines addressing a memory cell within the block of memory cells. A different inhibit voltage is applied to each of two or more of the n blocks of memory cells. Each of the unselected second signal lines is a pathway through which leakage current may potentially flow due to the operating current flowing through the selected first signal line and a memory cell addressed by the unselected second signal line and the selected first signal line.

The different inhibit voltages applied to each of the two or more blocks of memory cells are selected so as to reduce the difference between a leakage current flowing through a first memory cell of one of the two or more memory cell blocks and a leakage current flowing through a second memory cell of another of the two or more memory cell blocks. The first memory cell is addressed by the selected first signal line and an unselected second signal line to which a first inhibit voltage is applied for the one memory cell block. The second memory cell is addressed by the selected first signal line and an unselected second signal line to which a second inhibit voltage is applied for the other memory cell block.

BRIEF DESCRIPTION OF THE DRAWINGS

Exemplary embodiments of the application will be more clearly understood from the following detailed description taken in conjunction with the accompanying drawings in which.

DETAILED DESCRIPTION OF THE EXEMPLARY EMBODIMENTS

Figure 1:
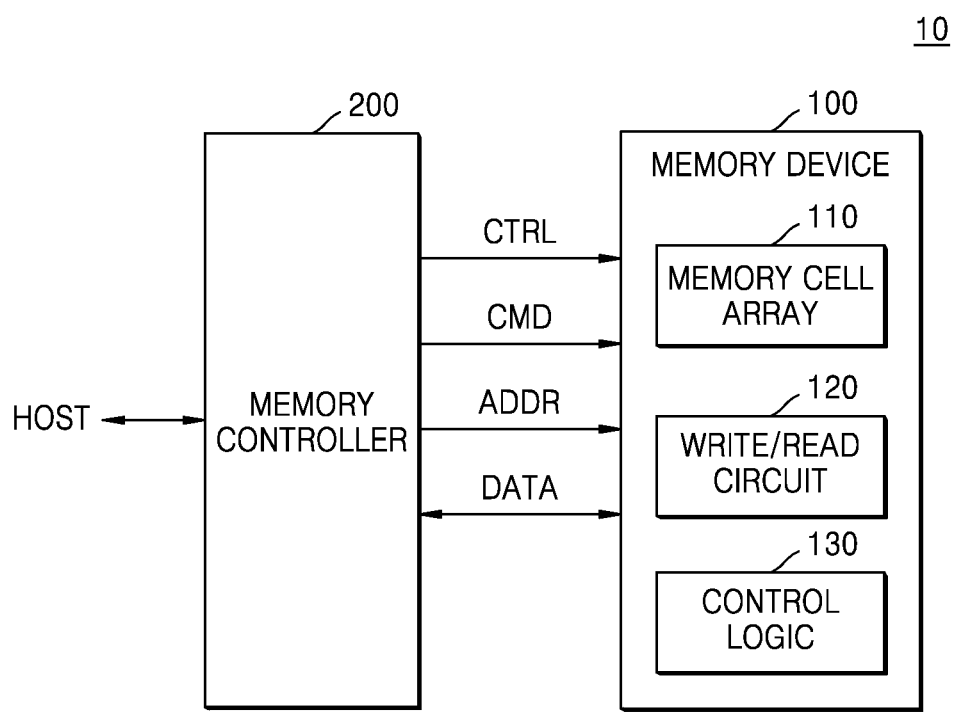
FIG. 1 is a block diagram of a memory system including a resistive memory device, according to an exemplary embodiment of the application.

The present application will now be described more fully with reference to the accompanying drawings, in which exemplary embodiments of the application are shown. The application may, however, be embodied in many different forms, and should not be construed as being limited to the embodiments set forth herein. Thus, the application may include all revisions, equivalents, or substitutions which are included in the concept and the technical scope related to the present application. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the application.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic block diagram of a memory system 10 including a resistive memory device 100, according to an exemplary embodiment of the application.

Referring to FIG. 1, the memory system 10 may include the resistive memory device 100 (hereinafter, referred as the memory device 100) and a memory controller 200. The memory device 100 may include a memory cell array 110, a write/read circuit 120, and a control logic 130. Since the memory cell array 110 includes resistive memory cells, the memory system 10 may be called a resistive memory system.

In response to a write/read request from a host, the memory controller 200 may control the memory device 100 to read data stored in the memory device 100 or to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. Also, data DATA to be written and data DATA to be read may be exchanged between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, Advanced Technology Attachment (ATA), Serial-ATA, Parallel-ATA, SCSI, ESDI, and Integrated Drive Electronics (IDE).

The memory cell array 110 may include a plurality of memory cells (not shown) that are disposed respectively in regions where a plurality of first signal lines and a plurality of second signal lines cross each other. The memory device 100 including the memory cell array 110 may be referred to as a cross-point memory device.

In the present exemplary embodiment, the plurality of first signal lines may be a plurality of bit lines, and the plurality of second signal lines may be a plurality of word lines. In another embodiment, the plurality of first signal lines may be a plurality of word lines, and the plurality of second signal lines may be a plurality of bit lines.

In the present exemplary embodiment, each of the memory cells may be a single level cell (SLC) that stores one bit data, or may be a multilevel cell (MLC) that may store at least two-bit data. Alternatively, the memory cell array 110 may include both SLCs and MLCs. When one bit data is written to one memory cell, the memory cells may have two resistance level distributions according to the written data. Alternatively, when two-bit data is written to one memory cell, the memory cells may have four resistance level distributions according to the written data. In another embodiment, if a memory cell is a triple level cell (TLC) that stores three-bit data, the memory cells may have eight resistance level distributions according to the written data. However, one or more exemplary embodiments of the application are not limited thereto. Thus, in other embodiments, each of the memory cells may store at least four-bit data.

Also, in the present exemplary embodiment, the memory cell array 110 may include memory cells having a two-dimensional horizontal structure. In another exemplary embodiment, the memory cell array 110 may include memory cells with a three-dimensional vertical structure.

According to the exemplary embodiment, the memory cell array 110 may include a plurality of cell regions. The plurality of cell regions may be defined in various ways, for example, each of the cell regions may be a page unit including a plurality of memory cells connected to the same word line. As another example, the cell region may include a plurality of memory cells that are connected to the word lines and bit lines, and the word lines may be connected to one row decoder (or row switch block) and the bit lines may be connected to one column decoder (or column switch block). In addition, the cell region may be defined as a tile.

The memory cell array 110 may include resistance-type memory cells or resistive memory cells that include a variable resistor device (not shown) having a variable resistor. For example, when the resistance of the variable resistor device that is formed of a phase change material (e.g., Ge—Sb—Te) changes according to temperature, a resistive memory device may be Phase-change RAM (PRAM). As another example, when the variable resistor device is formed of complex metal oxide including an upper electrode, a lower electrode, and transition metal oxide therebetween, the resistive memory device may be Resistive RAM (RRAM). As another example, when the variable resistor device is formed of an upper electrode of a magnetic material, a lower electrode of a magnetic material, and a dielectric therebetween, the resistive memory device may be Magnetic RAM (MRAM). Hereinafter, it is assumed that the memory cell array 110 is RRAM.

The write/read circuit 120 may perform write and read operations on the memory cells. The write/read circuit 120 may include a write driver for writing data in the memory cells and a sense amplifier for amplifying data read from the memory cells. The write/read circuit 120 may be selectively connected to a selected first signal line or a selected second signal line connected to a selected memory cell. In the exemplary embodiment, if the write/read circuit 120 is connected to the selected first signal line, a plurality of pulses may be applied to the selected memory cell via the selected first signal line. In another exemplary embodiment, if the write/read circuit 120 is connected to the selected second signal line, the plurality of pulses may be applied to the selected memory cell via the selected second signal line.

The control logic 130 may control the write/read operations of the memory device 100. The control logic 130 may control voltages or signals applied to the plurality of memory cells, for example, a set write voltage, a reset write voltage, an inhibit voltage, a set pulse or a reset pulse, so that the write/read operations may be normally performed on a memory cell that is selected from among the plurality of memory cells.

When performing the write/read operations on the selected memory cell, a selection voltage (for example, the set write voltage or read voltage) and a current necessary for performing the write/read operations are applied to the selected memory cell via the selected first signal line, and an inhibit voltage is applied to the unselected memory cells for preventing leakage current. Here, in a case of the unselected memory cells, one ends of which are connected to the selected first signal line applying the selection voltage (hereinafter, referred to as half-selected memory cells), the selection voltage is applied to one ends of the half-selected memory cells via the selected first signal line and the inhibit voltage is applied to the other ends of the half-selected memory cells via the unselected second signal line. Here, the signal lines have resistive components and the current flows through the selected first signal line, a voltage drop occurs in the selection voltage applied to each of the selected memory cells and the half-selected memory cells via the selected first signal line due to an IR drop. Accordingly, voltages at opposite ends of the half-selected memory cell become different according to a physical location of each of the half-selected memory cells, for example, a distance from a point to which the selection voltage is applied from outside on the selected first signal line (for example, a write circuit or a read circuit), and accordingly, the leakage current may increase.

According to the present exemplary embodiment, the control logic 130 may adjust a voltage level of the inhibit voltage that is applied to each of the half-selected memory cells, in consideration of the physical location of each of the half-selected memory cells so that the voltages at the opposite ends of the half-selected memory cell may be maintained constant even when the voltage drop occurs in the selection voltage.

In the exemplary embodiment, the control logic 130 determines an operating current flowing through the selected first signal line and may divide the memory cell array 110 into n blocks (n is two or greater integer) based on a value of the operating current. Accordingly, the second signal line or the first signal line may be divided into n groups according to the physical location thereof. In the exemplary embodiment, the control logic 130 may determine into how many blocks (i.e., the value of n) the memory cell array 110 is divided based on the current value of the operating current.

The control logic 130 may determine a plurality of inhibit voltages so that inhibit voltages having different voltage levels may be applied to the unselected second signal line included in each of the n blocks. For example, the control logic 130 may determine the number of inhibit voltages or the voltage levels of the inhibit voltages. In one embodiment, the control logic 130 may determine voltage differences among the plurality of inhibit voltages based on the current value of the operating current.

As described above, according to the present exemplary embodiment, the inhibit voltages applied to the half-selected memory cells are adjusted according to the physical locations of the half-selected memory cells so as to constantly maintain the voltage difference between the opposite ends of the half-selected memory cell and to reduce the leakage current even when the voltage drop occurs in the selection voltage applied to the ends of the memory cells.

In addition, the memory controller 200 and the memory device 100 may be integrated as one semiconductor device. For example, the memory controller 200 and the memory device 100 may be integrated as one semiconductor device forming a memory card. For example, the memory controller 200 and the memory device 100 may be integrated into a semiconductor device and thus may configure a PC card (a PCMCIA card), a compact flash card (CF card), a smart media card (SM/SMC), a memory stick, a multimedia card (MMC, RS-MMC, or MMCmicroO), an SD card (SD, miniSD, or microSD), or a universal flash storage (UFS). As another example, the memory controller 200 and the memory device 100 may be integrated into a semiconductor device and thus may form a Solid State Disk/Drive (SSD).

Operations of the memory device 100 included in the resistive memory system 10 having the above structure will be described below with reference to FIG. 2.

Figure 2:
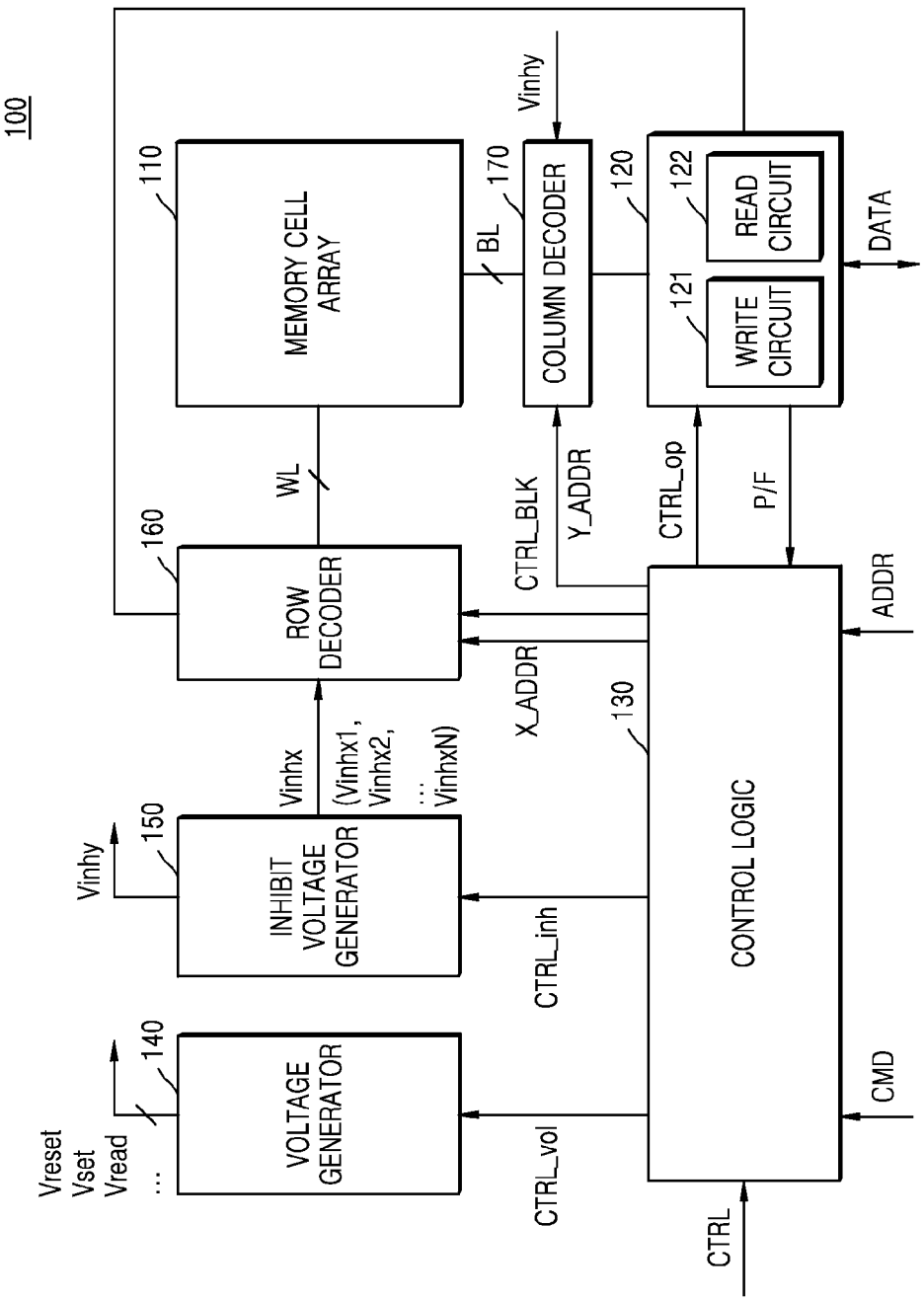
FIG. 2 is a block diagram of an example of the memory device of FIG. 1.

FIG. 2 is a block diagram of the memory device 100 of FIG. 1.

Referring to FIG. 2, the memory device 100 may include the memory cell array 110, the write/read circuit 120, the control logic 130, a voltage generator 140, an inhibit voltage generator 150, a row decoder 160, and a column decoder 170. The write/read circuit 120 may include a write circuit 121 and a read circuit 122. Hereinafter, components included in the memory device 100 will be described as below.

The memory cell array 110 may be connected to the plurality of first signal lines and the plurality of second signal lines. Also, the memory cell array 110 may include a plurality of memory cells that are respectively arranged on regions where the plurality of first signal lines and the plurality of second signal lines cross each other. Hereinafter, it is assumed that the plurality of first signal lines are bit lines BL, and the plurality of second signal lines are word lines WL.

The write/read circuit 120 may be selectively connected to the row decoder 160 or the column decoder 170, and accordingly, is selectively connected to the word lines WL or the bit lines BL to write data in the memory cell or to read data from the memory cell. In the exemplary embodiment, the write circuit 121 and the read circuit 122 may be connected to the word line WL. In another exemplary embodiment, the write circuit 121 and the read circuit 122 may be connected to the bit lines BL. In another exemplary embodiment, the write circuit 121 may be connected to the word lines WL and the read circuit 122 may be connected to the bit lines BL. In another exemplary embodiment, the write circuit 121 may be connected to the bit lines BL and the read circuit 122 may be connected to the word lines WL.

The write/read circuit 120 may write data DATA input from outside in the memory cell array 110, or may sense and output the data written in the memory cell array 110, according to the control of the control logic 130. Also, the write/read circuit 120 may provide the control logic 130 with the writing or reading result. For example, the write/read circuit 120 may perform a verification operation for detecting a result of the writing operation and may provide the control logic 130 with the verification result.

The write circuit 121 is connected to the selected bit line BL via the column decoder 170 and may provide the selected memory cell MC with a pulse to perform the programming (that is, writing) operation. As such, data DATA to be stored may be input to the memory cell array 110. Here, the pulse may be a programming pulse or a write pulse. In the exemplary embodiment, the pulse may be a current pulse, and in another exemplary embodiment, the pulse may be a voltage pulse.

In particular, the write circuit 121 may perform a set write operation, that is, programming the selected memory cell MC so that a resistance of the selected memory cell MC is reduced. In addition, the write circuit 121 may perform a reset write operation, that is, programming the selected memory cell MC so that the resistance of the selected memory cell MC is increased.

In the present exemplary embodiment, the write circuit 121 may provide the selected memory cell MC with a plurality of current pulses sequentially, and the plurality of current pulses may have current values that increase according to an increase in the number of programming loops. In the exemplary embodiment, the write circuit 121 provides the selected memory cell MC with the plurality of current pulses sequentially so as to perform a set write operation on the selected memory cell MC.

Also, in the present exemplary embodiment, the write circuit 121 may provide the selected memory cell MC with a plurality of voltage pulses sequentially, and the plurality of voltage pulses may have voltage values that increase according to an increase in the number of programming loops. In the exemplary embodiment, the write circuit 121 provides the selected memory cell MC with the plurality of voltage pulses so as to perform the reset write operation on the selected memory cell MC.

The read circuit 122 may be connected to the selected bit line BL or the selected word line WL so as to read data DATA stored in the selected memory cell MC, and accordingly, the data DATA stored in the memory cell array 110 may be output. In detail, the read circuit 122 may perform a general read operation on the selected memory cell MC, in a case where a read command is transmitted from the memory controller 200. Also, the read circuit 122 may perform a pre-read operation for reading an initial resistive state of the selected memory cell MC by performing a read operation on the selected memory cell MC before performing the write operation on the selected memory cell MC.

Moreover, after performing the write operation on the selected memory cell MC, the read circuit 122 may perform a verifying read operation for determining whether the write operation on the selected memory cell MC is finished. In particular, the read circuit 122 reads the resistances of the selected memory cells MC, to which first to N-th pulses are respectively applied and provides the write circuit 121 or the control logic 130 with the reading result.

In a general read operation, the read circuit 122 may provide read data DATA to the outside of the memory device 100, for example, to the memory controller 200. Also, in a case of the pre-read operation or the verifying read operation, the read circuit 122 may provide the read data DATA as a pass/fail signal P/F representing whether the write operation has succeeded to a component inside the memory device 100, for example, the control logic 130 or the write circuit 121.

The control logic 130 may output various control signals for writing data DATA in the memory cell array 110 or reading data DATA from the memory cell array 110, based on a command CMD, an address ADDR, and a control signal CTRL transmitted from the memory controller 200. The various control signals output from the control logic 130 may be provided to the write/read circuit 120, the voltage generator 140, the inhibit voltage generator 150, the row decoder 160, and the column decoder 170, and accordingly, the control logic 130 may control overall operations in the memory device 100.

In particular, the control logic 130 may generate operation control signals CTRL_op based on the command CMD and the control signal CTRL, and the operation control signals CTRL_op may be provided to the write/read circuit 120.

Also, the control logic 130 may generate a voltage control signal CTRL_vol and an inhibit control signal CTRL_inh based on the command CMD, the control signal CTRL, and the pass/fail signal P/F transmitted from the read circuit 122. The control logic 130 may provide the voltage control signal CTRL_vol and the inhibit control signal CTRL_inh respectively to the voltage generator 140 and the inhibit voltage generator 150.

Here, the voltage control signal CTRL_vol is a signal for adjusting levels of the voltages provided from the voltage generator 140, and the inhibit control signal CTRL_inh may be a signal for adjusting the number or voltage levels of column and row inhibit voltages Vinhy and Vinhx provided from the inhibit voltage generator 150.

Moreover, the control logic 130 divides the address ADDR into a row address X_ADDR and a column address Y_ADDR to provide the row decoder 160 with the row address X_ADDR and the column decoder 170 with the column address Y_ADDR.

In addition, as described above with reference to FIG. 1, even if the voltage drop occurs in the selection voltage, for example, the set write voltage or the read voltage, applied to the selected first signal line, for example the selected bit line BL, the control logic 130 may adjust the voltage levels of the inhibit voltages applied to the half-selected memory cells in consideration of the physical locations of the half-selected memory cells, so that the voltages at the opposite ends of the half-selected memory cells connected to the selected bit line may be maintained constant.

The control logic 130 determines the operating current flowing through the selected bit line, for example, a set current or a read current, and may divide the memory cell array 110 into n blocks based on a value of the operating current. The control logic 130 may determine how many blocks the memory cell array 110 is divided into (i.e., a value of n) based on the value of the operating current. The control logic 130 may determine the n blocks and the row inhibit voltage Vinhx applied to each of the n blocks. In another exemplary embodiment, the control logic 130 may determine the operating current and may determine differences between N row inhibit voltages Vinhx1, Vinhx2, . . . , VinhxN (here, N is an integer that is equal to or greater than n) based on the value of the operating current.

The control logic 130 may provide the row decoder 160 with a block control signal CTRL_BLK for controlling the n blocks. The block control signal CTRL_BLK may include an address of each of the n blocks and information about the row inhibit voltage applied to each of the n blocks.

The voltage generator 140 may generate various kinds of voltages for performing the write, read, and erase operations on the memory cell array 110, based on the voltage control signal CTRL_vol. In particular, the voltage generator 140 may generate the selection voltages applied to the selected memory cell MC, for example, a reset write voltage Vreset, a set write voltage Vset, and a read voltage Vread. Also, the voltage generator 140 may generate a power voltage and a pre-charge voltage that are applied to the write/read circuit 120.

The inhibit voltage generator 150 may generate the column inhibit voltage Vinhy applied to the unselected bit line and the row inhibit voltage Vinhx applied to the unselected word line based on the inhibit control signal CTRL_inh. In the present exemplary embodiment, the inhibit voltage generator 150 may generate a plurality of row inhibit voltages Vinhx1, Vinhx2, . . . , and VinhxN. The number of row inhibit voltages Vinhx1, Vinhx2, . . . , and VinhxN may be determined based on the current value of the operating current flowing through the selected bit line. In another exemplary embodiment, voltage differences between the plurality of row inhibit voltages Vinhx1, Vinhx2, . . . , and VinhxN may be determined based on the current value of the operating current flowing through the unselected bit line.

In the present exemplary embodiment, the voltage generator 140 and the inhibit voltage generator 150 are shown as separate functional blocks, but voltage generator 140 and the inhibit voltage generator 150 may be formed as one functional block.

The row decoder 160 is connected to the memory cell array 110 via the plurality of word lines WL, and activates the selected word line WL from among the plurality of word lines WL in response to the row address X_ADDR transmitted from the control logic 130. That is, the row decoder 160 may control the voltage applied to the selected word line WL from among the plurality of word lines WL, or may control a connecting relation of the selected word line, in response to the row address X_ADDR. For example, the row decoder 160 may provide the selected word line WL with the ground voltage Vss or the reset write voltage Vreset, and may provide the unselected word lines WL with the row inhibit voltage Vinhx for preventing the leakage current.

According to the present exemplary embodiment, the row decoder 160 may provide each of the n blocks with its corresponding row inhibit voltage among the row inhibit voltages Vinhx1, Vinhx2, . . . , VinhxN based on the block control signal CTRL_BLK. Accordingly, the unselected word lines WL included in each of the n blocks may receive the row inhibit voltage corresponding thereto.

The column decoder 170 is connected to the memory cell array 110 via the plurality of bit lines BL and may activate the bit line BL selected from among the plurality of bit lines BL in response to the column address Y_ADDR transmitted from the control logic 130. In particular, the column decoder 170 may control the voltages applied to the selected bit line and the unselected bit lines from among the plurality of bit lines BL, or a connecting relation of the selected bit line, in response to the column address Y_ADDR. For example, the column decoder 170 may provide the selected bit line BL with the set write voltage and the read voltage Vread, and may provide the unselected bit lines BL with the column inhibit voltage Vinhy for preventing the leakage current.

In the present exemplary embodiment, the row decoder 160 is connected to the word lines WL and the column decoder 170 is connected to the bit lines BL, and accordingly, the row decoder 160 and the column decoder 170 are described as above. However, one or more exemplary embodiments of the application are not limited thereto. According to another exemplary embodiment, the row decoder 160 may be connected to the bit line BL and the column decoder 170 may be connected to the word line WL.

Figure 3:
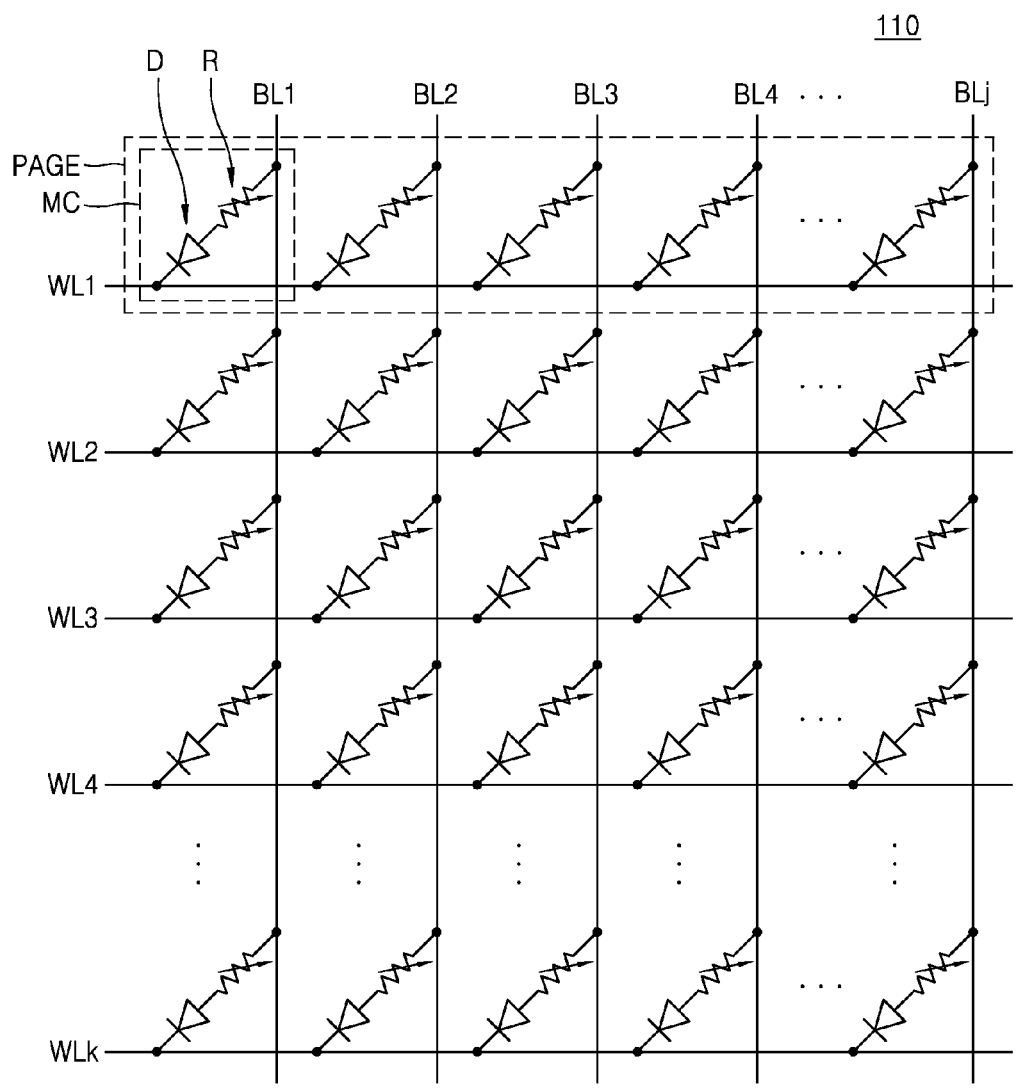
FIG. 3 is a detailed circuit diagram of a memory cell array of FIG. 2.

FIG. 3 is a circuit diagram of the memory cell array 110 of FIG. 2. The memory cell array 110 may include a plurality of memory blocks, and FIG. 3 shows one memory block.

Referring to FIG. 3, the memory cell array 110 may include memory cells having a horizontal structure. The memory cell array 110 may include a plurality of word lines WL1 through WLk, a plurality of bit lines BL1 through BLj, and a plurality of memory cells MC. Here, the number of word lines WL, the number of bit lines BL, and the number of memory cells MC may vary depending upon one or more embodiments of the present application. Also, the memory cells MC selected by the same word line WL may be defined as a page unit PAGE.

According to the present embodiment, each of the plurality of memory cells MC may include a variable resistor device R and a selection device D. Here, the variable resistor device R may be referred to as a variable resistive material and the selection device D may be referred to as a switching device.

In an embodiment, the variable resistor device R may be connected between one of the bit lines BL1 through BLj and the selection device D, and the selection device D may be connected between the variable resistor device R and one of the word lines WL1 through WLk. However, one or more embodiments of the application are not limited thereto, and the selection device D may be connected between one of the bit lines BL1 through BLj and the variable resistor device R, and the variable resistor device R may be connected between the selection device D and one of the word lines WL1 through WLk.

In the present embodiment, the variable resistor device R may be switched to one of a plurality of resistive states, in response to an electric pulse applied thereto. The variable resistor device R may include a resistive material for storing data. The variable resistor device R may include a phase-change material of which a crystal state changes according to current. The phase-change material may include various materials GaSb, InSb, InSe, or $Sb_2Te_3$, obtained by a compound of two elements, GeSbTe, GaSeTe, InSbTe, $SnSb_2Te_4$, or InSbGe, obtained by a compound of three elements, or AgInSbTe, (GeSn)SbTe, GeSb(SeTe), or $Te_{81}Ge_{15}Sb_2S_2$, obtained by a compound of four elements.

The phase-change material may have an amorphous state that is relatively resistive, and a crystal state that is relatively low-resistive. A phase of the phase-change material may be changed by Joule's heat that is generated by current. By using the change of the phase of the phase-change material, data may be written.

In another embodiment, the variable resistor device R may include at least one of perovskite compounds, transition metal oxide, magnetic materials, ferromagnetic materials, and anti-ferromagnetic materials.

The selection device D may be connected between one of the word lines WL1 through WLk and the variable resistor device R, and according to a voltage applied to the connected word line and bit line, current that is supplied to the variable resistor device R may be controlled. In FIG. 3, the selection device D is a PN junction diode or a PIN junction diode, and an anode of the diode may be connected to the variable resistor device R and a cathode of the diode may be connected to one of the plurality of word lines WL1 through WLk. Here, when a difference between the voltages at the anode and the cathode of the diode is greater than a threshold voltage of the diode, the diode is turned on to supply current to the variable resistor device R. In FIG. 3, the selection device D is a diode, but one or more embodiments of the present application are not limited thereto, that is, the selection device D may be another device that may be switched according to another embodiment.

Figure 4:
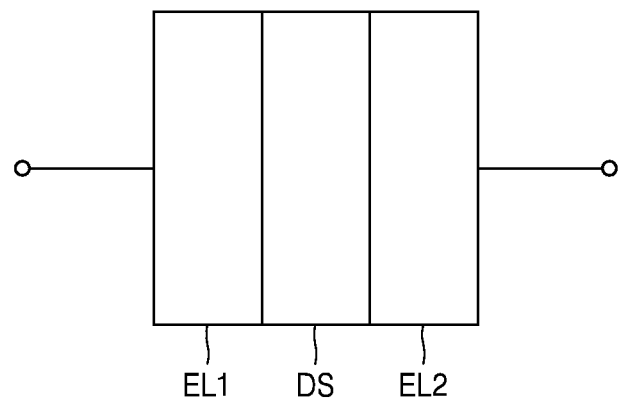
FIG. 4 is a diagram of an example of a variable resistor device included in a memory cell of FIG. 3.

FIG. 4 is a diagram of the variable resistor device R included in the memory cell MC of FIG. 3.

Referring to FIG. 4, the variable resistor device R may include a first electrode EL1 a second electrode EL2, and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminum (Al), copper (Cu), titanium nitride (TiN), titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$), or strontium zirconate oxide ($StZrO_3$).

The data storage film DS may be formed of a bipolar resistive memory material or a unipolar resistive memory material. The bipolar resistive memory material may be programmed into a set state or a reset state according to a polarity of a pulse, and the bipolar resistive memory material may include Perovskite-based materials. In addition, the unipolar resistive memory material may be programmed into a set state or a reset state by the pulse of the same polarity, and the unipolar resistive memory material may include a transition metal oxide such as NiOx or TiOx.

Figure 5A:
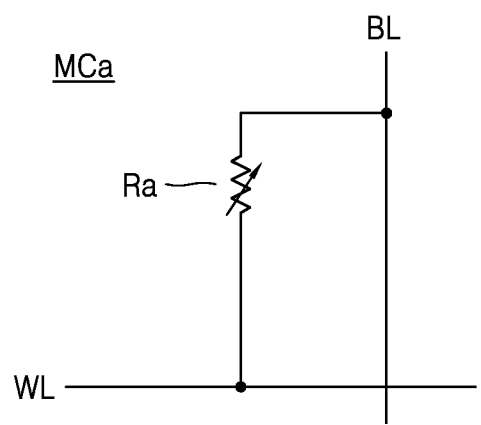
FIGS. 5A through 5C are circuit diagrams showing modified examples of the memory cell of FIG. 3.
Figure 5B:
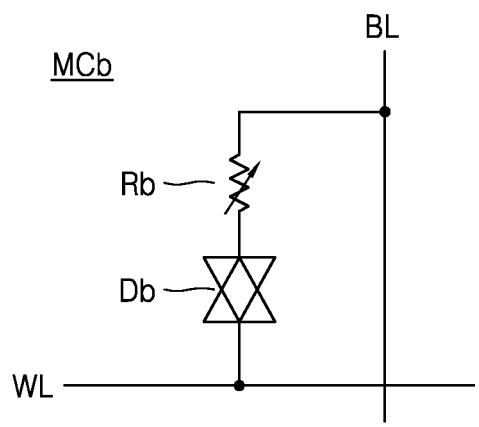
Figure 5C:
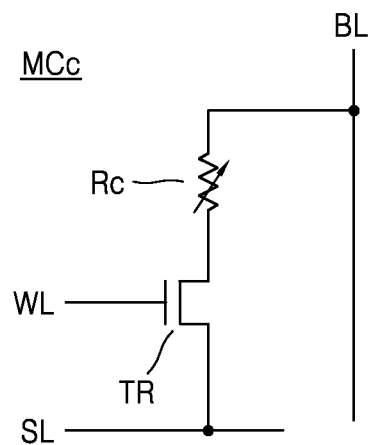

FIGS. 5A through 5C are circuit diagrams of modified examples of the memory cell MC of FIG. 3.

Referring to FIG. 5A, a memory cell MCa may include a variable resistor device Ra that may be connected between a bit line BL and a word line WL. The memory cell MCa may store data due to voltages that are applied to the bit line BL and the word line WL, respectively.

Referring to FIG. 5B, a memory cell MCb may include a variable resistor device Rb and a bidirectional diode Db. The variable resistor device Rb may include a resistive material so as to store data. The bidirectional diode Db may be connected between the variable resistor device Rb and a word line WL, and the variable resistor device Rb may be connected between a bit line BL and the bidirectional diode Db. Positions of the bidirectional diode Db and the variable resistor device Rb may be switched with each other. By using the bidirectional diode Db, leakage current that may flow in an unselected resistor cell may be cut.

Referring to FIG. 5C, a memory cell MCc may include a variable resistor device Rc and a transistor TR. The transistor TR may be a selection device, i.e., a switching device, that supplies or cuts a current to the variable resistor device Rc, according to a voltage of a word line WL. The transistor TR may be connected between the variable resistor device Rc and the source line SL, and may be controlled turn-on or turn-off by the voltage of a word line WL. The variable resistor device Rc may be connected between a bit line BL and the transistor TR. Positions of the transistor TR and the variable resistor device Rc may be switched with each other. The memory cell MCc may be selected or may not be selected, according to ON or OFF of the transistor TR that is driven by the word line WL.

Figure 6A:
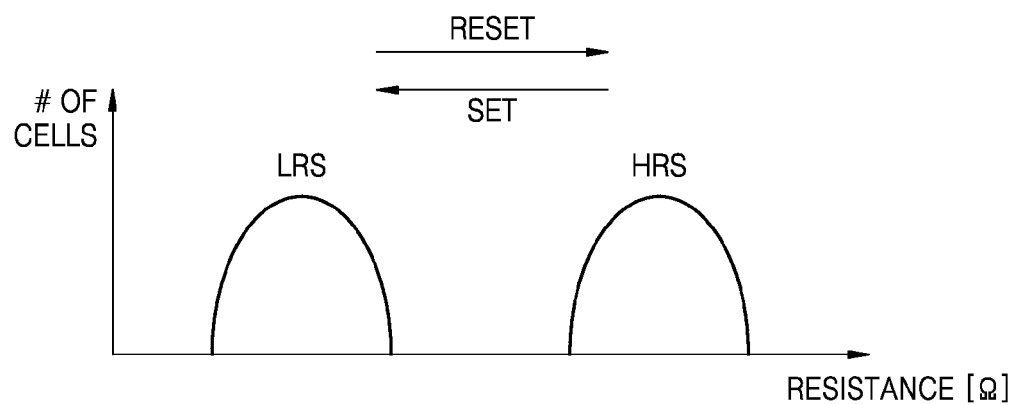
FIG. 6A is a graph showing a distribution of memory cells according to resistances thereof, when the memory cell of FIG. 3 is a single level cell.

FIG. 6A is a graph illustrating a distribution of the memory cells MC according to resistances thereof, when the memory cell MC of FIG. 3 is an SLC.

Referring to FIG. 6A, a horizontal axis denotes resistance, and a vertical axis denotes the number of memory cells MC. For example, if the memory cell MC is an SLC that is programmed with one bit, the memory cell MC may have a low resistance state LRS or a high resistance state HRS.

The low resistance state LRS and the high resistance state HRS may respectively correspond to data '0' and data '1'. In one embodiment, a resistance level R may increase from data '0' to data '1'. That is, the low resistance state LRS may correspond to the data '0', and the high resistance state HRS may correspond to the data '1'.

An operation of applying a write pulse to the memory cell MC to switch the memory cell MC from the high resistance state HRS to the low resistance state LRS is referred to as a set operation or a set writing operation. Also, an operation of applying a write pulse to the memory cell MC to switch the memory cell MC from the low resistance state LRS to the high resistance state HRS is referred to as a reset operation or a reset writing operation.

Figure 6B:
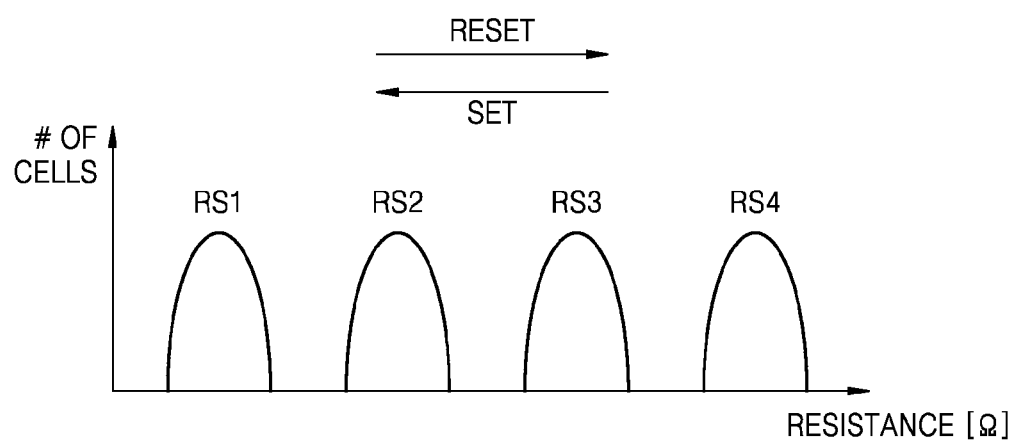
FIG. 6B is a graph showing a distribution of memory cells according to resistances thereof, when the memory cell of FIG. 3 is a multi-level cell.

FIG. 6B is a graph showing distribution of the memory cells MC according to resistances thereof, if the memory cell MC of FIG. 3 is an MLC.

Referring to FIG. 6B, a horizontal axis denotes resistance, and a vertical axis denotes the number of memory cells MC. For example, if the memory cell MC is an MLC that is programmed with two bits, the memory cell MC may have one of a first resistance state RS1, a second resistance state RS2, a third resistance state RS3, and a fourth resistance state RS4.

However, one or more embodiments of the present application are not limited thereto, that is, a plurality of memory cells may include triple level cells (TLCs) storing data of 3 bits, and accordingly, each of the memory cells may have one of eight resistance states. In another embodiment, the plurality of memory cells may include memory cells, each storing data of 4 bits or greater.

When comparing the MLC with the SLC, the MLC has narrower intervals between resistance distributions, and thus, reading errors may occur due to a small change in the resistance in the MLC. Therefore, first, second, third, and fourth resistance states RS1, RS2, RS3, and RS4 may respectively have resistor ranges that do not overlap with each other in order to ensure a read margin.

Each of the first, second, third, and fourth resistance states RS1, RS2, RS3, and RS4 may correspond to one of data '00', data '01', data '10', and data '11'. In the present embodiment, a resistance level R may increase in order of the data '11', the data '01', the data '00', and the data '10'. That is, the first resistance state RS1 may correspond to the data '11', the second resistance state RS2 may correspond to the data '01', the third resistance state RS3 may correspond to the data '00', and the fourth resistance state RS4 may correspond to the data '10'.

Figure 7:
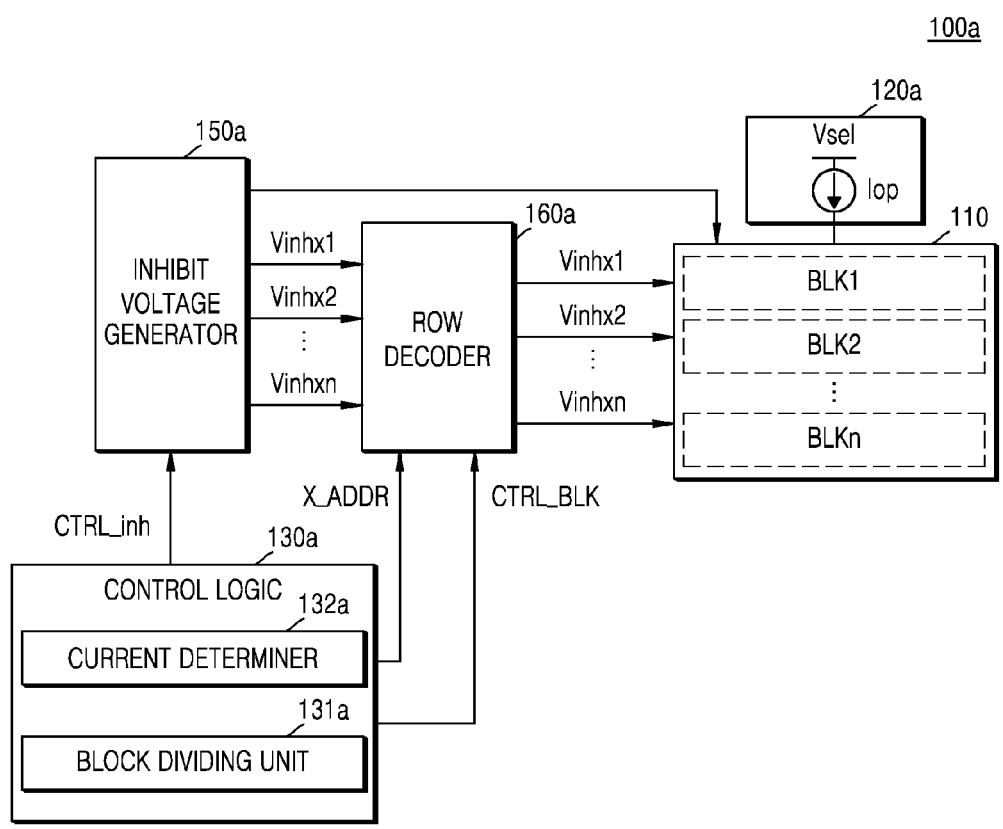
FIG. 7 is a block diagram of a memory device including control logic according to another exemplary embodiment of the application.

FIG. 7 is a block diagram of a memory device 100a including a control logic 130a according to another embodiment of the application.

Referring to FIG. 7, the memory device 100a may include the memory cell array 110, a write/read circuit 120a, the control logic 130a, an inhibit voltage generator 150a, and a row decoder 160a. The memory device 100a of the present embodiment is a modified example of the memory device 100 of FIG. 2, and thus, descriptions with reference to FIG. 2 may be applied to the present embodiment. Also, although not shown in FIG. 7, the components included in the memory device 100 of FIG. 2 may be included in the memory device 100a of the present embodiment.

The write/read circuit 120a may provide the selected first signal line, for example, the selected bit line, with the selection voltage Vsel and the operating current Iop. Here, the selection voltage Vsel may be the set write voltage Vset or the read voltage Vread, and the operating current Iop may be a current pulse for performing the set write operation (hereinafter, referred to as a set current) or a current pulse for reading data (hereinafter, referred to as a read current). The operating current Iop may be a sum of the cell current flowing in the selected memory cell MC connected to the selected bit line BL, and the leakage current flowing in the unselected memory cells MC connected to the selected bit line BL, for example, the half-selected memory cells MC.

The control logic 130a may divide the memory cell array 110 into a plurality of blocks BLK1 through BLKn according to physical locations thereof. The memory cell array 110 may be divided into the plurality of blocks BLK1 through BLKn in a direction in which the selected bit line BL extends. Each of the plurality of blocks BLK1 through BLKn may include a plurality of memory cells MC and a plurality of second signal lines, for example, word lines WL. Here, the control logic 130a determines the operating current Iop, and may determine the number of blocks BLK1 through BLKn based on the value of the operating current Iop. To do this, the control logic 130a may include a current determiner 132a and a block dividing unit 131a.

The current determiner 132a may determine the operating current Iop flowing through the selected bit line BL. The current determiner 132a may determine the operating current Iop based on an operating mode of the memory device 100a. In one exemplary embodiment, the current determiner 132a may determine the current value of the operating current Iop based on the set current applied to the first signal line that is selected and changed according to the number of programming loops during the set write operation. In another exemplary embodiment, the current determiner 132a may determine the current value of the operating current Iop based on the number of memory cells, on which the set write operation is performed, or the number of memory cells, on which the read operation is performed.

The block dividing unit 131a determines the number of blocks, that is, n, based on the current value of the operating current Iop, and then, may divide the memory cell array 110 into the n blocks BLK1 through BLKn. For example, the block dividing unit 131a may determine that the number of blocks increases when the current value of the operating current Iop increases, and that the number of blocks decreases when the current value of the operating current Iop decreases. In one exemplary embodiment, the block dividing unit 131a may set the numbers of blocks corresponding to a period of a plurality of current values, and then may select one of the numbers based on the current value of the operating current Iop. The block dividing unit 131a may generate the block control signal CTRL_BLK based on the information about the n blocks BLK1 through BLKn, and then, may provide the row decoder 160a with the block control signal CTRL_BLK.

The row decoder 160a may provide the n blocks BLK1 through BLKn with n row inhibit voltages Vinhx1 through Vinhxn based on the block control signal CTRL_BLK. The row decoder 160a selects n row inhibit voltages Vinhx1 through Vinhxn from among N row inhibit voltages Vinhx1 through VinhxN (N is an integer equal to or greater than n) provided from the inhibit voltage generator 150a based on the block control signal CTRL_BLK, and may provide the n blocks BLK1 through BLKn with the n row inhibit voltages Vinhx1 through Vinhxn, respectively.

Figure 8:
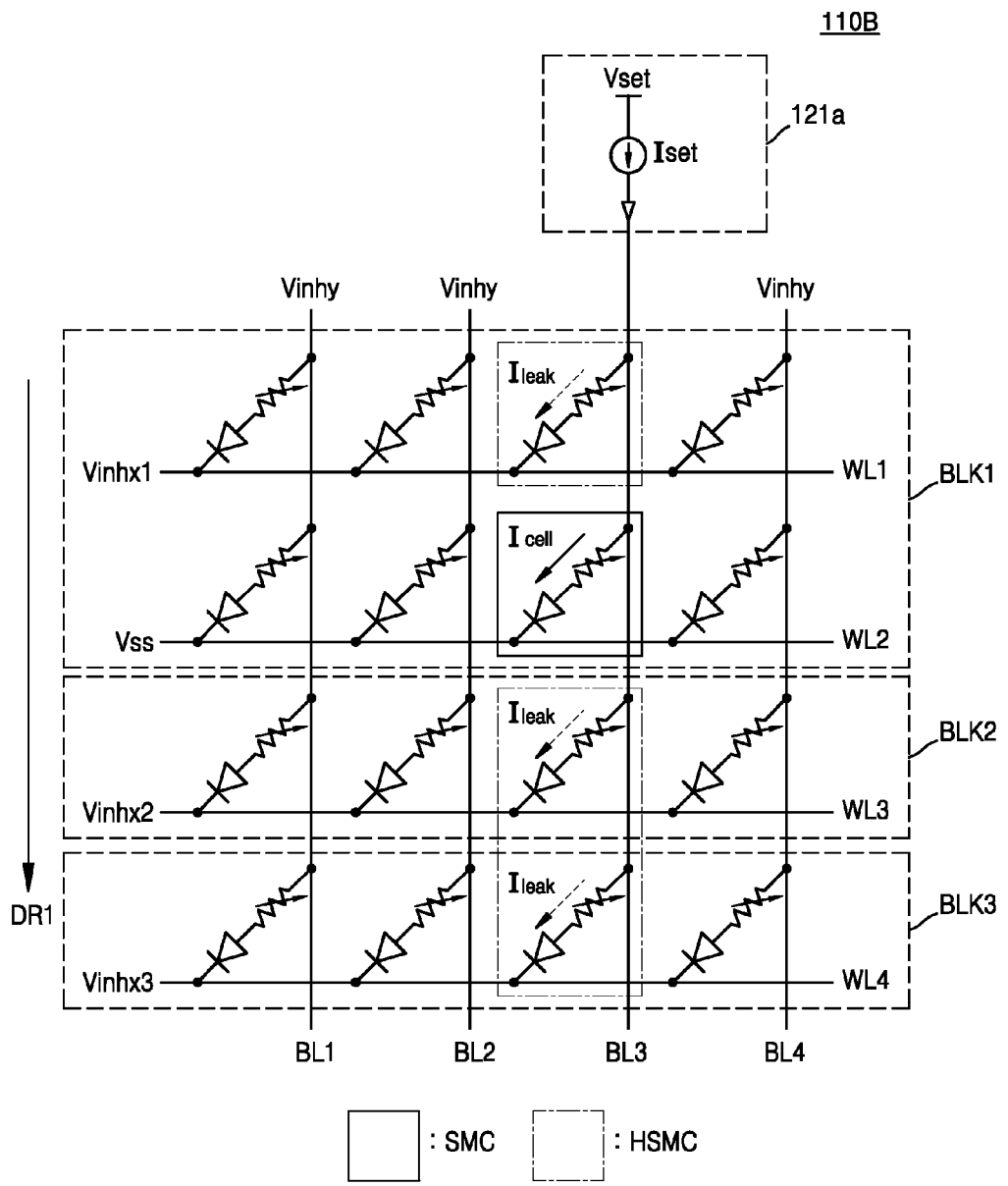
FIG. 8 is a circuit diagram showing voltages applied to memory cells in an established writing operation, according to an exemplary embodiment of the present application.

FIG. 8 is a circuit diagram of voltages applied to the memory cells MC during a set write operation according to an exemplary embodiment of the application.

Referring to FIG. 8, a write circuit 121a may be connected to a selected bit line BL3 to provide the selected bit line BL3 with the set write voltage Vset and the set current Iset. The set write voltage Vset may be provided to the memory cells connected to the selected bit line BL3, for example, the selected memory cell SMC and the half-selected memory cells HSMC, via the selected bit line BL3. A voltage Vss having a voltage level that is lower than that of the set write voltage Vset is applied to a selected word line WL2 so that a voltage difference for performing the set write operation may be generated between the opposite terminals of the selected memory cell SMC, and accordingly, the cell current Icell may flow in the selected memory cell SMC.

The inhibit voltage may be applied to the unselected memory cells. The column inhibit voltage Vinhy may be applied to unselected bit lines BL1, BL2, and BL4. Row inhibit voltages Vinhx1, Vinhx2, and Vinhx3 may be applied to unselected word lines WL1, WL3, and WL4. Here, in the memory cells connected to the selected bit line BL3 among the unselected memory cells, that is, the half-selected memory cells, leakage current Ileak may flow due to the voltage differences between the set write voltage Vset and the row inhibit voltages Vinhx1, Vinhx2, and Vinhx3.

In addition, the memory cell array 110 may be divided into a plurality of blocks, for example, three blocks BLK1, BLK2, and BLK3, in a direction in which the bit line extends. Each of the plurality of blocks BLK1, BLK2, and BLK3 may include at least one word line. Different row inhibit voltages Vinhx1, Vinhx2, and Vinhx3 may be applied to the unselected word lines WL1, WL3, and WL4 included in the plurality of blocks BLK1, BLK2, and BLK3. The voltage levels of the row inhibit voltages Vinhx1, Vinhx2, and Vinhx3 may be set by taking into account the voltage drop of the set write voltage Vset. For example, the voltage drop of the set write voltage Vset may increase away from the write circuit 121a. Therefore, the row inhibit voltage having the highest voltage level is applied to the unselected word line that is included in a block that is the closest to the write circuit 121a and the row inhibit voltage having the lowest voltage level may be applied to the unselected word line included in a block that is the farthest from the write circuit 121a, so that the voltage differences between the opposite terminals of the half-selected memory cells HSMC may be constant. For example, if the first inhibit voltage Vinhx1 has the highest voltage level and the third inhibit voltage Vinhx3 has the lowest voltage level among the plurality of row inhibit voltages Vinhx1, Vihnx2, and Vihnx3, the first inhibit voltage Vinhx1 is applied to the first word line WL1 included in the first block BLK1 that is the closest to the write circuit 121a and the third inhibit voltage Vinhx3 is applied to the fourth word line WL4 included in the third block BLK3 that is the farthest from the write circuit 121a, as shown in FIG. 8.

Figure 9A:
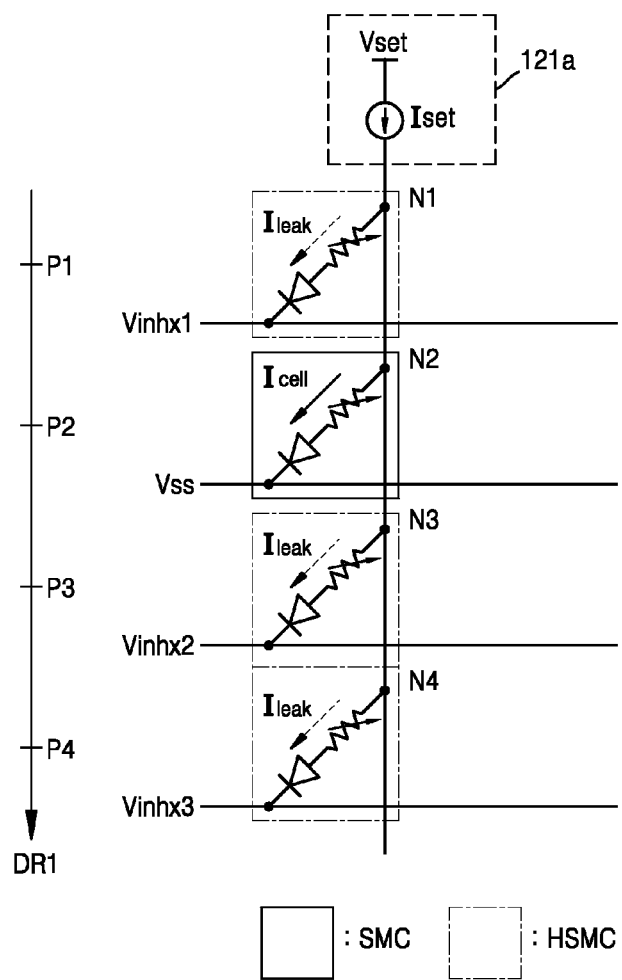
FIG. 9A is a diagram of a selected bit line and memory cells connected to the selected bit line shown in FIG. 8.
Figure 9B:
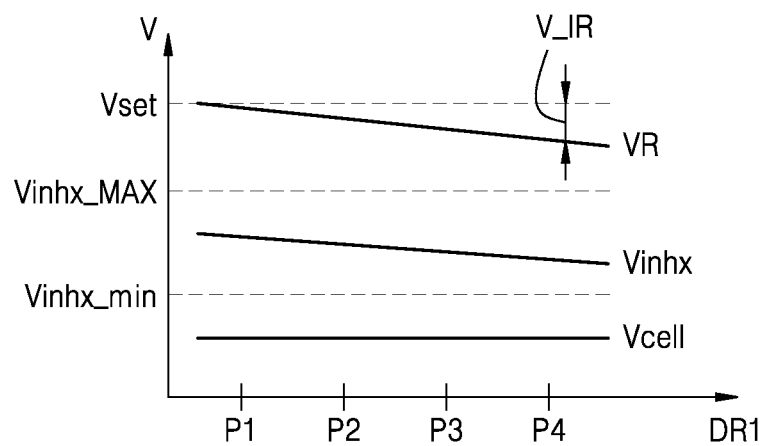
FIG. 9B is a graph showing voltages applied to half-selected memory cells of FIG. 9A according to locations of the memory cells.
Figure 9C:
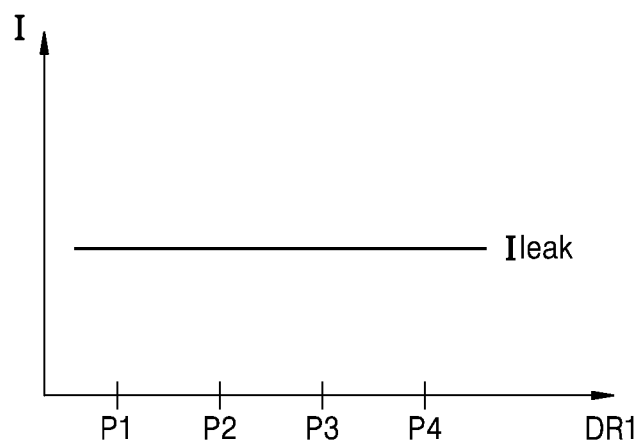
FIG. 9C is a graph showing leakage currents in the half-selected memory cells of FIG. 9A according to locations of the memory cells.

FIG. 9A shows the selected bit line BL3 of FIG. 8 and the memory cells connected to the selected bit line BL3, FIG. 9B is a graph showing voltages applied to the half-selected memory cells of FIG. 9A according to locations thereof, and FIG. 9C is a graph showing the leakage currents flowing in the half-selected memory cells of FIG. 9A according to the locations thereof. For convenience of description, it is assumed that the set writing operation is performed on the memory device.

Referring to FIGS. 9A and 9B, the voltage drop (IR drop) V_IR occurs in the set write voltage Vset, and a range of the voltage drop V_IR increases away from the write circuit 121a. Thus, the voltage level of the voltage VR applied to the resistor of the memory cell may decrease away from the write circuit 121a. That is, the voltage levels of the voltages applied to the resistor terminals, that is, nodes N1, N2, N3, and N4, of the memory cells may decrease in a first direction DR1. In the present exemplary embodiment, the row inhibit voltage Vinhx having the low voltage level may be applied to the half-selected memory cells HSMC located far from the write circuit 121a. Accordingly, the voltage Vcell between the opposite terminals of a half-selected memory cell HSMC may be constant even when the voltage drop of the set write voltage Vset occurs, regardless of the location of the half-selected memory cell HSMC. Accordingly, the leakage current Ileak flowing in the half-selected memory cells HSMC may be constant regardless of the locations of the half-selected memory cells HSMC, as shown in FIG. 9C.

Figure 10:
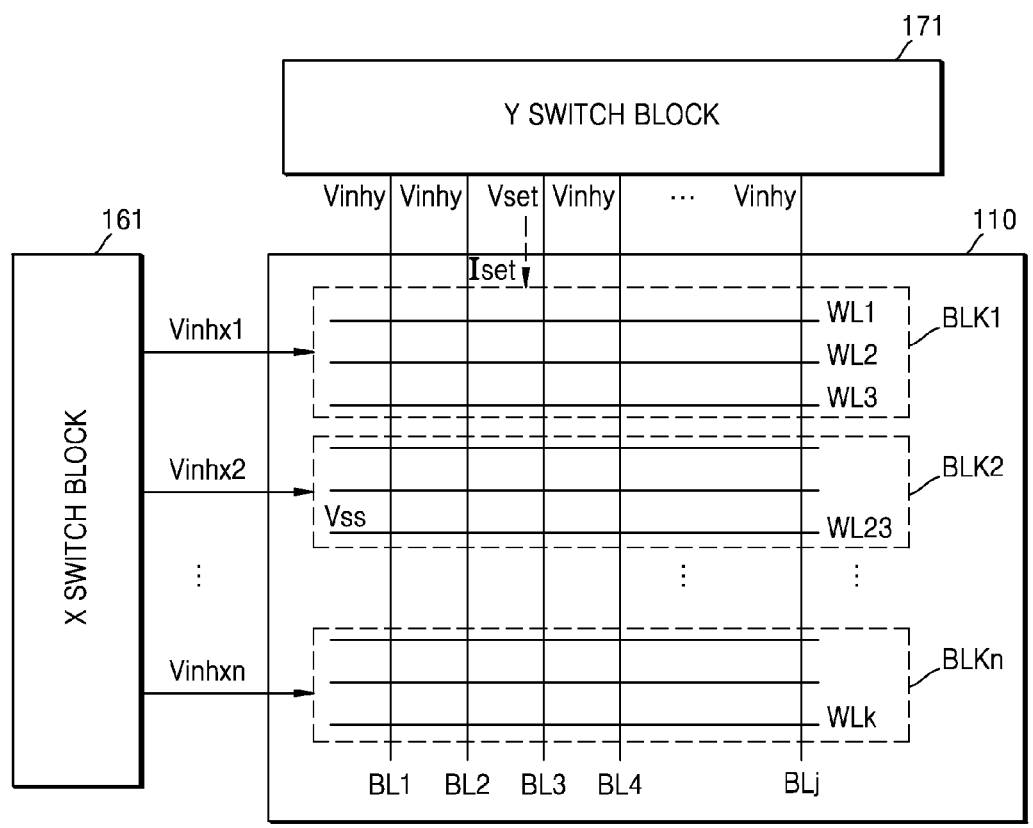
FIG. 10 is a diagram of the memory cell array according to the exemplary embodiment of the application in more detail.

FIG. 10 is a diagram showing a dividing of the memory cell array 110 according to the exemplary embodiment of the application in more detail.

Referring to FIG. 10, the memory cell array 110 may include a plurality of bit lines BLj and a plurality of word lines WLk, and a plurality of memory cells (not shown) may be arranged on points where the plurality of bit lines BLj and the plurality of word lines WLk cross each other.

Bias voltages may be applied to the plurality of bit lines BLj via a first switch block 171. The first switch block 171 may apply the set write voltage Vset and the set current Iset to the selected bit line BL3. The set write voltage Vset and the set current Iset may be provided from the write circuit (not shown). Also, the first switch block 171 may apply the column inhibit voltage Vinhy to unselected bit lines BL1, BL2, . . . , BLj.

Bias voltages may be applied to the plurality of word lines WLk via a second switch block 161. The second switch block 161 applies a ground voltage Vss to the selected word line, and may apply the plurality of row inhibit voltages Vinhx1 through Vinhxn to the unselected word lines WL1, . . . , WL22, WL24, . . . , WLk. Here, the first switch block 171 and the second switch block 161 may be at least parts of the column decoder 170 and the row decoder 160 shown in FIG. 2, respectively.

In addition, the memory cell array 110 may be divided into n blocks BLK1 through BLKn, and each of the n blocks BLK1 through BLKn may include at least one word line WL. The n row inhibit voltages Vinhx1 through Vinhxn having different voltage levels from each other may be applied to the at least one word line included in the n blocks BLK1 through BLKn.

Figure 11:
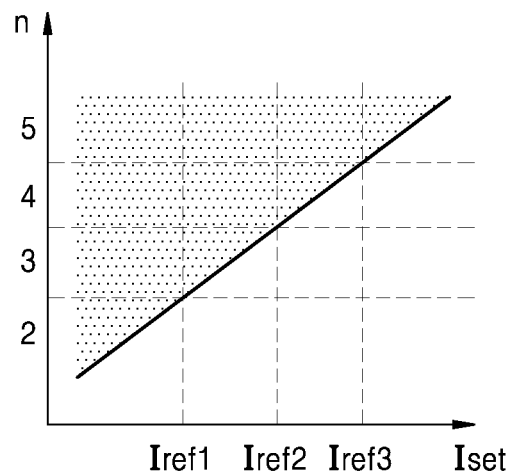
FIG. 11 is a graph illustrating an example of determining the number of blocks corresponding to an established current via a block discrimination unit of FIG. 7.

FIG. 11 is a graph showing an example of determining the number of blocks corresponding to the set current via the block dividing unit 131a of FIG. 7.

Referring to FIG. 11, the number of blocks may increase in correspondence to the increase in the set current Iset. For example, the block dividing unit (131a of FIG. 7) may determine the number of blocks, that is, n, to be 2, when the current value of the set current Iset is less than a first reference value Iref1, may determine the number of blocks as 3 when the current value of the set current Iset is equal to or greater than the first reference value Iref1 and less than a second reference value Iref2, may determine the number of blocks as 4 when the current value of the set current Iset is equal to or greater than the second reference value Iref2 and less than a third reference value Iref3, and may determine the number of blocks as 5 when the current value of the set current Iset is equal to or greater than the third reference value Iref3. As described above, the number of blocks may be determined by comparing the set current Iset with the reference values.

In one exemplary embodiment, current intervals between the reference values, namely, the first through third reference values Iref1 through Iref4, may be constant. Accordingly, the block dividing unit 131a may increase the number of blocks whenever the set current Iset increases by the predetermined current value.

In one or more exemplary embodiments, if the current intervals between the reference values, namely, the first through third reference values Iref1 through Iref4, are not constant, the block dividing unit 131a may determine the number of blocks by comparing the set current Iset with the reference values that are set in advance.

Figure 12:
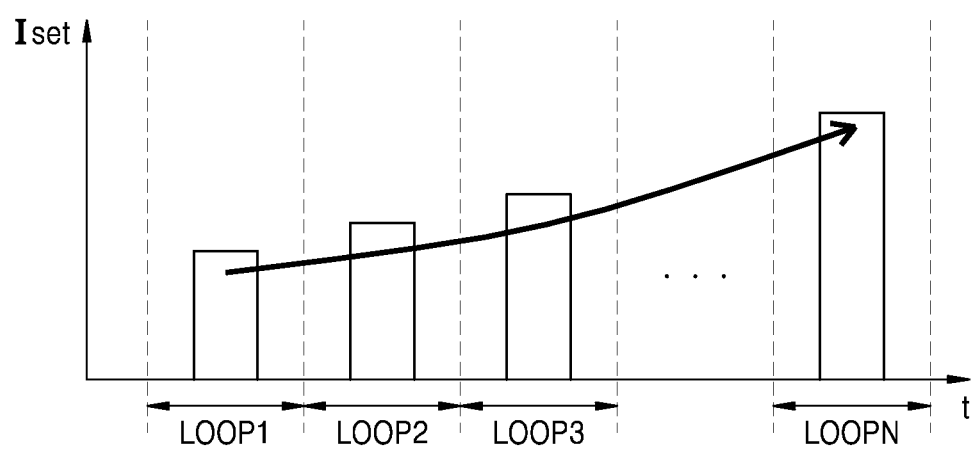
FIG. 12 is a graph illustrating an example of determining an operating current via a current determiner of FIG. 7.

FIG. 12 is a graph showing an example of determining the operating current via the current determiner 132a of FIG. 7.

Referring to FIG. 12, when the set writing operation is performed on the memory device, an amplitude or a pulse width of the current pulse applied to the selected memory cell may be increased according to the number of times of performing the programming loops. For example, as shown in FIG. 12, when the number of times of performing the programming loops increases, the amplitude or the pulse width of the current pulse also increases, and accordingly, the set current Iset may be increased. The current determiner (132a of FIG. 7) may determine the current value of the set current Iset based on the amplitude or the pulse width of the current pulse according to the programming loops. In one exemplary embodiment, the current determiner 132a may acquire information about the amplitude or the pulse width of the current pulse according to the number of times of performing the programming loops, and may calculate the set current Iset based on the number of times of performing the programming loops.

Figure 13:
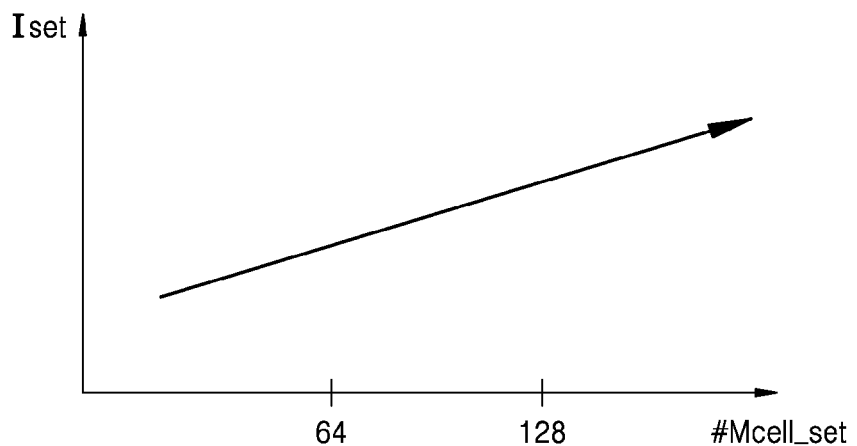
FIG. 13 is a graph illustrating another example of determining an operating current via a current determiner of FIG. 6.

FIG. 13 is a graph showing an example of determining the operating current via the current determiner 132a of FIG. 7, according to another embodiment of the application.

When the set writing operation or the reading operation is performed on the memory device, the operating current may vary depending on the number of memory cells connected to the selected first signal line, for example, the selected bit line, to perform the set writing operation or the reading operation. For example, as shown in FIG. 13, when the number of memory cells (#Mcell_set), on which the set writing operation is performed, is increased, the total cell current flowing in the selected memory cells increases, and accordingly, the set current Iset may be increased. The current determiner (132a of FIG. 7) may determine the current value of the set current Iset based on the number of memory cells #Mcell_set on which the set writing operation is simultaneously performed. In one embodiment, the current determiner 132a may acquire information about the cell current in one memory cell or the unit memory cell, and may calculate the set current Iset based on the number of memory cells #Mcell_set, on which the set writing operation is performed.

Figure 14:
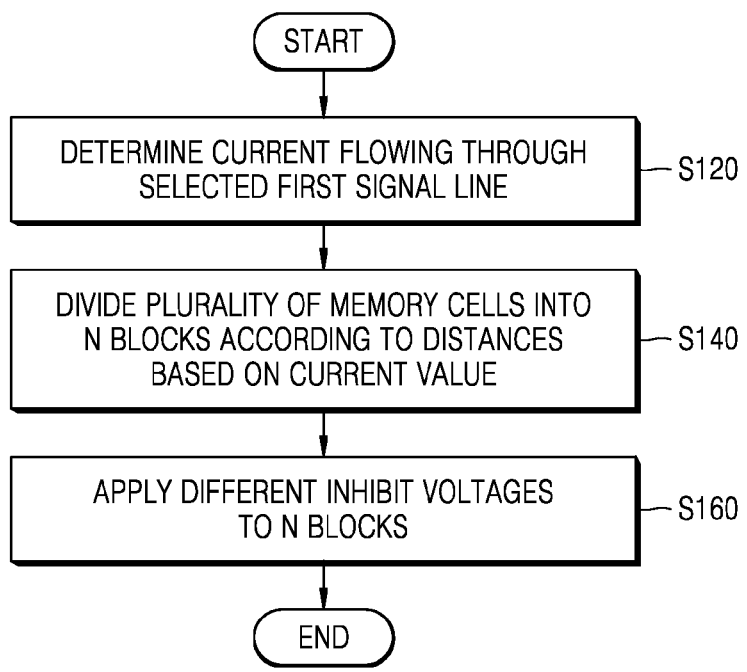
FIG. 14 is a flowchart illustrating a method of operating a semiconductor, according an exemplary embodiment of the application.

FIG. 14 is a flowchart illustrating a method of operating a memory device, according to an exemplary embodiment of the application.

Referring to FIG. 14, the method of operating the memory device, according to the present exemplary embodiment, is a method of applying inhibit voltages to a plurality of memory cells for performing a writing operation or a reading operation on selected memory cells included in a memory cell array. The above descriptions with reference to FIGS. 1 through 13 may be applied to the method according to the present exemplary embodiment. Hereinafter, the method of operating the memory device, according to the present exemplary embodiment, will be described with reference to FIG. 14 and also FIGS. 1 through 13.

In operation S120, an operating current flowing through a selected first signal line is determined. A selection voltage is provided to at least one point on the selected first signal line, and the selection voltage may be applied to the selected memory cell and half-selected memory cell connected to the selected first signal line through the selected first signal line. Here, a cell current may flow to the selected memory cell and a leakage current may flow to the half-selected memory cells. Accordingly, an operating current corresponding to a sum of the cell current and the leakage current may flow in the selected first signal line. The control logic 130 may determine the operating current in advance based on the operating mode of the memory device, for example, whether the set writing operation is performed or the reading operation is performed, the amplitude (or the pulse width) of the current pulse according to the number of times of performing the programming loops, or the number of memory cells on which the set writing operation is performed. According to another exemplary embodiment, the control logic 130 feeds back to the memory device information about the operating current flowing through the selected first signal line when the set writing operation or the reading operation is performed under a certain condition, and then, may determine the operating current in each of the operating modes based on the information.

In operation S140, the plurality of memory cells may be classified as n blocks according to physical locations thereof, based on the current value of the operating current. In one exemplary embodiment, when the current value increases, the value of n also increases. In another exemplary embodiment, the value of n may be determined by comparing the current value of the operating current with reference values that are set in advance. In another exemplary embodiment, the method of operating the memory device may further include a process of setting the number of blocks corresponding to each of a plurality of current value sections, and may select one of the preset number of blocks based on the current value of the operating current in operation S140.

In operation S160, different inhibit voltages may be applied to the n blocks, respectively. Here, the inhibit voltage having a relatively high voltage level is applied to the block that is relatively close to at least one point to which the selection voltage is applied, among the n blocks, and the inhibit voltage having a relatively low voltage level is applied to the block located relatively far from the point to which the selection voltage is applied. Each of the n blocks includes at least one second signal line, and the inhibit voltages having different voltage levels may be applied respectively to the n blocks, each including unselected second signal lines.

Figure 15:
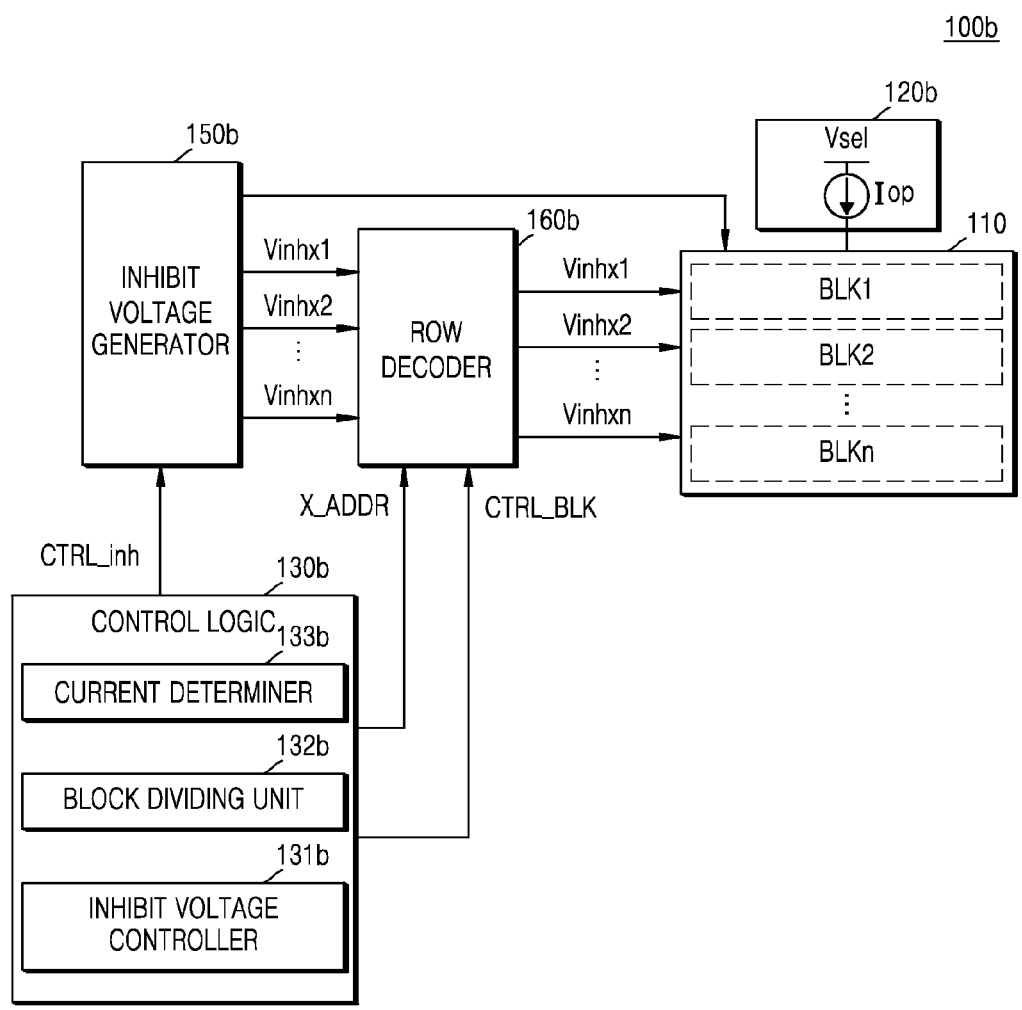
FIG. 15 is a block diagram of a memory device including control logic, according to another exemplary embodiment of the application.

FIG. 15 is a block diagram of a memory device 100b including a control logic 130b, according to another exemplary embodiment of the application.

Referring to FIG. 15, the memory device 100b may include the memory cell array 110, a write/read circuit 120b, the control logic 130b, an inhibit voltage generator 150b, and a row decoder 160b. The memory device 100b according to the present exemplary embodiment is a modified example of the memory device 100 shown in FIG. 2, and thus, descriptions with reference to FIG. 2 may be applied to the present exemplary embodiment. Also, although not shown in FIG. 15, elements included in the memory device 100 of FIG. 2 may be included in the memory device 100b according to the present exemplary embodiment.

Operations of the elements included in the memory device 100b of FIG. 15 are similar to those of the elements included in the memory device 100a of FIG. 7.

According to the present exemplary embodiment, the control logic 130b may include a current determiner 133b, a block dividing unit 132b, and an inhibit voltage controller 131b. Operations of the current determiner 133b and the block dividing unit 132b are substantially the same as those of the current determiner 132a and the block dividing unit 131a of the control logic 130a shown in FIG. 7, and thus, detailed descriptions thereof are omitted here.

The inhibit voltage controller 131b may determine voltage differences between the inhibit voltages Vinhx1, Vinhx2, . . . , Vinhxn applied to the unselected second signal lines, based on the current value of the operating current Iop. The inhibit voltage controller 131b may determine the voltage differences between the inhibit voltages Vihnx1, Vinhx2, . . . , Vinhxn to increase when the current value of the operating current Iop increases.

In one exemplary embodiment, the inhibit voltage controller 131b may control the inhibit voltage generator 150b to generate the row inhibit voltages Vinhx1, Vinhx2, . . . , Vinhxn having the voltage differences determined as above, wherein the number of row inhibit voltages Vinhx1, Vinhx2, . . . , Vinhxn is the same as the number of blocks BLK1 through BLKn in the memory cell array 110.

In another exemplary embodiment, the inhibit voltage controller 131b may control the inhibit voltage generator 150b to generate the plurality of row inhibit voltages Vinhx1, Vinhx2, . . . , VinhxN, the number of which is greater than the number of n blocks BLK1 through BLKn, and may provide the row decoder 160b with the determined voltage difference as the block control signal CTRL_BLK. The row decoder 160b may select n row inhibit voltages Vinhx1, Vinhx2, . . . , Vinhxn from among the plurality of row inhibit voltages Vinhx1, Vinhx2, . . . , VinhxN provided from the inhibit voltage generator 150b, based on the block control signal CTRL_BLK. Then, the row decoder 160b may provide the n blocks BLK1 through BLKn of the memory cell array 110 with the selected n row inhibit voltages Vinhx1, Vinhx2, . . . , Vinhxn.

In addition, in another exemplary embodiment, the plurality of blocks BLK1 through BLKn in the memory cell array 110 may be classified in advance, and then, the control logic 130b may determine the operating current Iop and may only adjust the voltage differences between the inhibit voltages Vinhx1, Vinhx2, . . . , Vinhxn based on the current value of the operating current Iop. Here, the block dividing unit 132b may be omitted from the control logic 130b.

Figure 16:
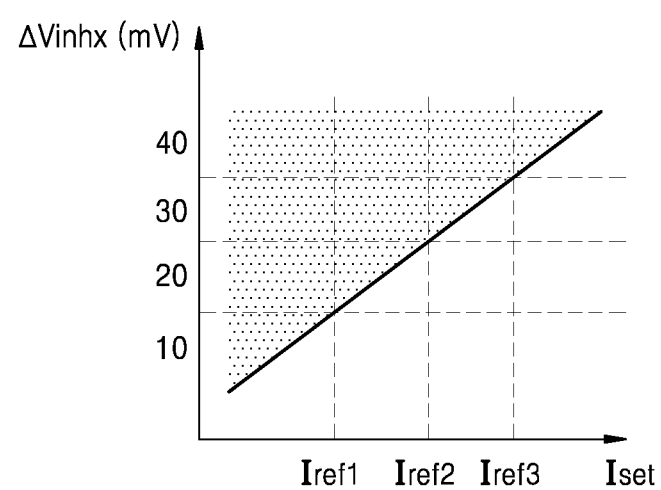
FIG. 16 is a graph showing an example of determining voltage differences among a plurality of inhibit voltages corresponding to an established current via an inhibit voltage controller of FIG. 15.

FIG. 16 is a graph showing an example of determining differences between the plurality of inhibit voltages via the inhibit voltage controller 131b of FIG. 15 based on the set current.

Referring to FIG. 16, the inhibit voltage controller 131b sets reference currents Iref1, Iref2, and Iref3 in advance, and compares the operating current Iop with the reference currents Iref1, Iref2, and Iref3 to set a voltage difference ΔVinhx based on a comparison result. In one exemplary embodiment, the voltage difference ΔVinhx between the plurality of inhibit voltages may increase in correspondence with the increase in the set current Iset, as shown in FIG. 16. Numerical values of FIG. 16 are examples, and detailed numerical values may vary depending on operating conditions of the memory device.

Figure 17:
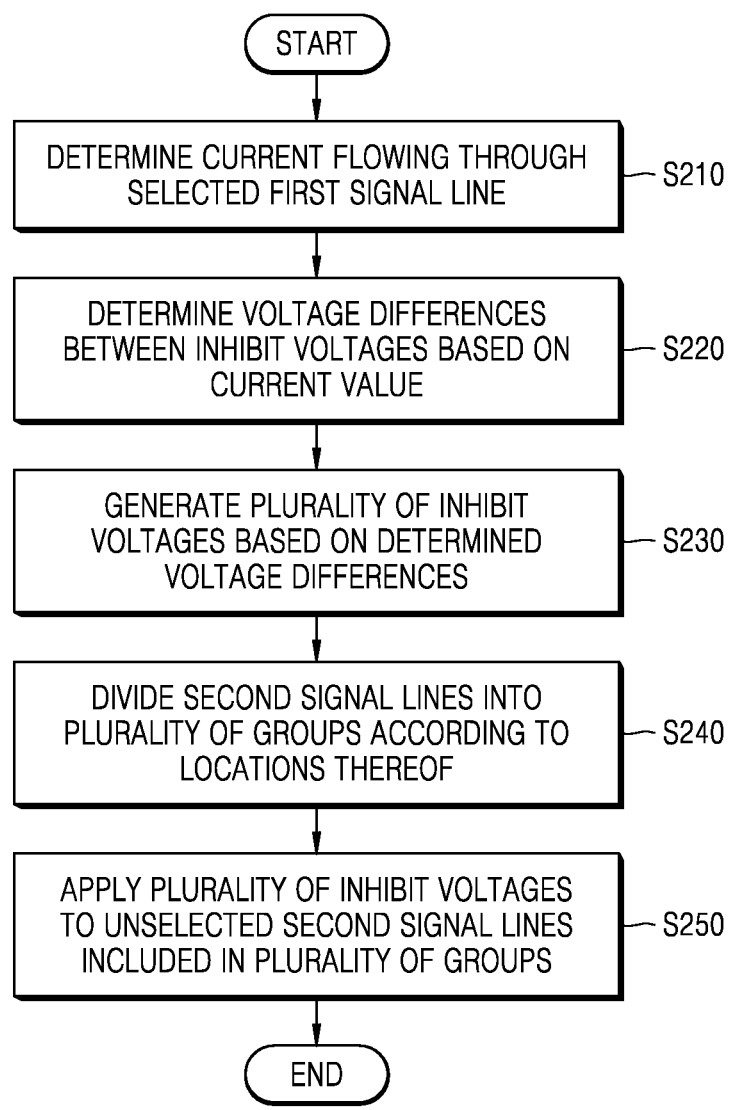
FIG. 17 is a flowchart illustrating a method of operating a memory device, according to another exemplary embodiment of the application.

FIG. 17 is a flowchart illustrating a method of operating a memory device, according to another exemplary embodiment of the application.

Referring to FIG. 17, the method of operating the memory device, according to the present exemplary embodiment, is a method of applying inhibit voltages to a plurality of memory cells for performing a writing operation or a reading operation on selected memory cells included in a memory cell array, and descriptions above with reference to FIGS. 1 through 16 may be applied to the method of the present exemplary embodiment. Hereinafter, the method of operating the memory device, according to the present exemplary embodiments, will be described with reference to FIG. 17 and FIGS. 1 through 16.

In operation S210, an operating current flowing through a selected first signal line is determined. A selection voltage is applied to at least one point on the selected first signal line, and the selection voltage may be applied to selected memory cells and half-selected memory cells connected to the selected first signal line through the selected first signal line. Here, a cell current may flow in the selected memory cell and a leakage current may flow in the half-selected memory cells. The operating current may be a sum of the cell current flowing in the selected memory cell and the leakage current flowing in the half-selected memory cells. The control logic 130 may determine the current value of the operating current in advance based on an operating mode of the memory device, for example, whether the set writing operation is performed or the reading operation is performed, an amplitude (or pulse width) of the current pulse according to the number of times of performing programming loops, or the number of memory cells on which the set writing operation is performed. In another exemplary embodiment, the control logic 130 feeds back to the memory device information about the operating current flowing through the selected first signal line when the set writing operation or the reading operation is performed under a certain condition, and then, may determine the operating current in each of the operating modes based on the information.

In operation S220, the differences between the inhibit voltages are determined based on the current value of the operating current. When the operating current increases, the voltage drop of the selection voltage may increase. Therefore, in order to compensate for the voltage drop of the selection voltage, the control logic 130 may determine that the differences between the inhibit voltages increase when the current value of the operating current increases.

In operation S230, the plurality of inhibit voltages are generated based on the determined differences. The control logic 130 provides the inhibit voltage generator 150 with the determined voltage differences as the inhibit voltage control signal CTRL_inh, and the inhibit voltage generator 150 may generate the plurality of inhibit voltages based on the inhibit voltage control signal CTRL_inh.

In operation S240, the second signal lines may be divided into a plurality of groups according to physical locations thereof. The control logic 130 may divide the memory cell array 110 into the plurality of blocks according to the physical location of second signal lines and each of the plurality of blocks may include a plurality of second signal lines. Accordingly, the plurality of second signal lines may be divided into the plurality of groups according to the physical locations thereof. Here, the physical location may denote a distance from the at least one point on the first signal line to which the selection voltage is applied.

In operation S250, the plurality of inhibit voltages are applied respectively to the plurality of groups, each including unselected second signal lines. That is, the inhibit voltage of a constant voltage level is applied to the unselected second signal lines included in one group, and the inhibit voltages of different voltage levels may be applied to the unselected second signal lines included in different groups from each other.

In one exemplary embodiment, the inhibit voltage having a relatively high voltage level is applied to the group that is relatively close to the at least one point in the selected first signal line, to which the selection voltage is applied, and the inhibit voltage having a relatively low voltage level is applied to the group that is relatively far from the at least one point to which the selection voltage is applied.

Figure 18:
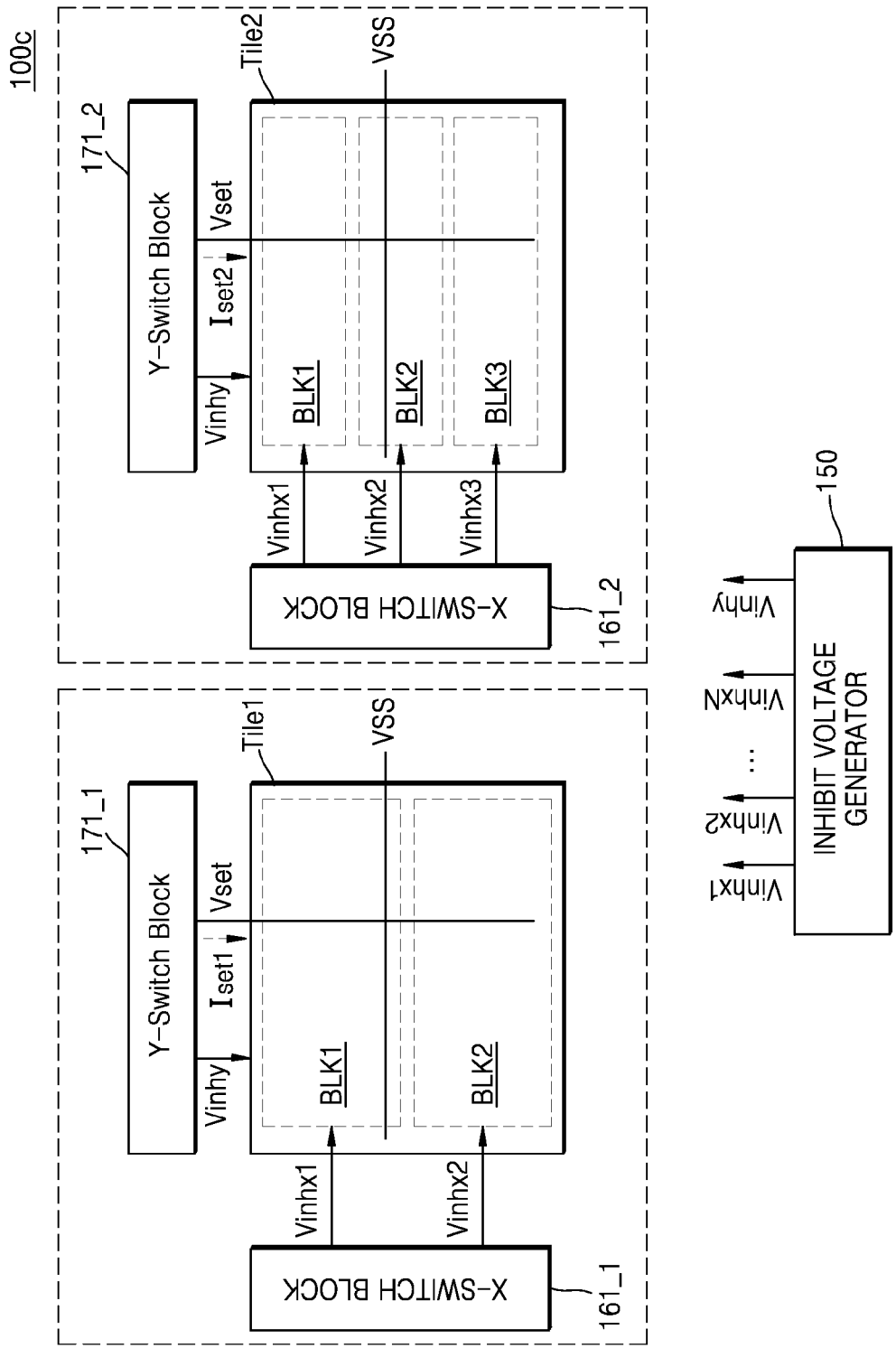
FIG. 18 is a block diagram of a memory device according to another exemplary embodiment of the application.

FIG. 18 is a block diagram of a memory device 100c according to another exemplary embodiment of the application.

As shown in FIG. 18, the memory device 100c may include a memory cell array (not shown, refer to 110 of FIG. 2), and the inhibit voltage generator 150. The memory device 100c according to the present exemplary embodiment is a modified example of the memory device 100 of FIG. 2, and the above descriptions with reference to FIG. 2 may be applied to the present exemplary embodiment. Also, although not shown in FIG. 18, the elements included in the memory device 100 of FIG. 2 may be also included in the memory device 100c according to the present exemplary embodiment.

In addition, the memory cell array (not shown, refer to 110 of FIG. 2) may include a plurality of cell regions, and the memory cell array of FIG. 18 includes a first tile Tile1 and a second tile Tile2. A tile may be defined variously, for example, the tile may be defined as a unit including the memory cells formed on the regions where the plurality of word lines commonly connected to one row decoder (or row switch block) and the plurality of bit lines commonly connected to one column decoder (or column switch block) cross each other.

First switch blocks 171_1 and 171_2 and second switch blocks 161_1 and 161_2 are connected respectively to the first and second tiles Tile1 and Tile2, and the selection voltage, the operating current, and the inhibit voltages may be applied to the first and second tiles Tile1 and Tile2 via the first and second switch blocks 161_1, 161_2, 171_1, and 171_2. Hereinafter, it is assumed that the memory device 100c performs the set writing operation, the set write voltage and the set current are provided to the selected first signal line via the first switch blocks 171_1 and 171_2, the column inhibit voltages Vinhy are applied to the unselected first signal lines, and at least some of the plurality of row inhibit voltages Vinhx1 through VinhxN are provided to the unselected second signal lines.

As shown in FIG. 18, the first and second tiles Tile1 and Tile2 may be divided into a plurality of blocks according to physical locations thereof. In one exemplary embodiment, the control logic (not shown, refer to 130 of FIG. 2) may divide the first and second tiles Tile1 and Tile2 into the plurality of blocks based on the set currents, namely, first and second set currents Iset1 and Iset2, respectively flowing in the first and second tiles Tile1 and Tile2. For example, the control logic divides the first tile Tile1 into two blocks BLK1 and BLK2 based on the current value of the first set current Iset1, and divides the second tile Tile2 into three blocks BLK1, BLK2, and BLK3 based on the current value of the second set current Iset2.

The inhibit voltage generator 150 generates the plurality of row inhibit voltages Vinhx1 through VinhxN to be provided to the second switch blocks 161_1 and 161_2, and generates the column inhibit voltage Vinhy to be provided to the first switch blocks 171_1 and 171_2. The second switch blocks 161_1 and 161_2 select at least some of the plurality of row inhibit voltages Vinhx1 through VinhxN based on a block control signal transmitted from the control logic, and may provide the selected row inhibit voltages to their corresponding blocks. For example, as shown in FIG. 18, the second switch block 161_1 connected to the first tile Tile1 may select two row inhibit voltages Vinhx1 and Vinhx2 from among the plurality of row inhibit voltages Vinhx1 through VinhxN, and may provide the selected row inhibit voltages respectively to the first and second blocks BLK1 and BLK2 of the first tile Tile1. The second switch block 161_2 connected to the second tile Tile2 may select three row inhibit voltages Vinhx1, Vinhx2, and Vinhx3 from among the plurality of row inhibit voltages Vinhx1 through VinhxN, and may provide the selected row inhibit voltages respectively to the first, second, and third blocks BLK1, BLK2, and BLK3 of the second tile Tile2.

In addition, as another exemplary embodiment, the first and second tiles Tile1 and Tile2 may be divided into the same number of blocks, and the control logic may determine differences between the row inhibit voltages provided to the first and second tiles Tile1 and Tile2 based on the set currents, namely, the first and second set currents Iset1 and Iset2, respectively flowing in the first and second tiles Tile1 and Tile2. The control logic determines differences between the row inhibit voltages provided to the first tile Tile1 based on the first set current Iset1, and may provide the second switch block 161_1 connected to the first tile Tile1 with information about the voltage differences as the block control signal. The control logic determines differences between the row inhibit voltages provided to the second tile Tile2 based on the second set current Iset2, and may provide the second switch block 161_2 connected to the second tile Tile2 with information about the voltage differences as the block control signal. The second switch blocks 161_1 and 161_2 may select the row inhibit voltages to be provided to the first and second tiles Tile1 and Tile2 from among the plurality of row inhibit voltages Vinhx1 through VinhxN, based on the block control signals.

As described above, the operation of dividing the memory cell array into the plurality of blocks and the operation of applying the inhibit voltages are performed in the tile unit, and then, the leakage current may be controlled in the tile unit.

Figure 19:
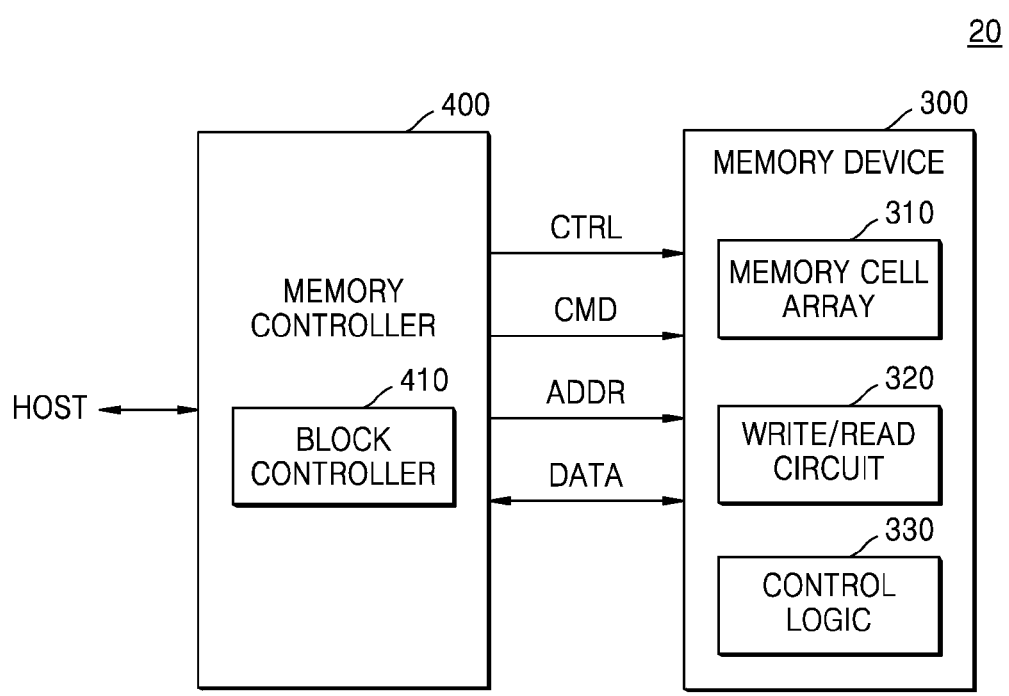
FIG. 19 is a schematic block diagram of a memory system including a memory device, according to another exemplary embodiment of the application.

FIG. 19 is a block diagram of a memory system 20 including a memory device 300, according to another exemplary embodiment of the application.

Referring to FIG. 19, the memory system 20 may include a memory device 300 and a memory controller 400. The memory device 300 may include a memory cell array 310, a write/read circuit 320, and a control logic 330. The memory controller 400 may include a block controller 410.

The block controller 410 determines the operating current flowing through a selected first signal line, and may divide the memory cell array 310 into n blocks (n is two or greater integer) based on a current value of the operating current. The block controller 410 may determine how many blocks are obtained from the memory cell array 310, that is, a value of n, based on the current value of the operating current. Also, the block controller 410 may determine a plurality of inhibit voltages so that inhibit voltages having different voltage levels from each other may be applied respectively to unselected second signal lines included in the n blocks. The block controller 410 may determine voltage differences among the plurality of inhibit voltages based on the current value of the operating current. The block controller 410 may provide the memory device 300 with the information about the blocks or the information about the inhibit voltages as the control signal CTRL and the address ADDR. The control logic 330 may control the inhibit voltage generator (not shown) to generate the plurality of inhibit voltages based on the control signal CTRL and the address ADDR, and may control the decoders, for example, the row decoder or the column decoder, to provide the plurality of inhibit voltages to their corresponding blocks.

Accordingly, during the write/read operation on the memory device 300, the inhibit voltages applied to the unselected memory cells may be adjusted according to the physical locations of the unselected memory cells so that the difference between the voltages at the opposite terminals of the unselected memory cells, in particular, the half-selected memory cells, may be maintained constant even if the voltage drop occurs in the selection voltage applied to one of the ends of the memory cells, and thereby reducing the leakage current occurring in the unselected memory cells.

Figure 20:
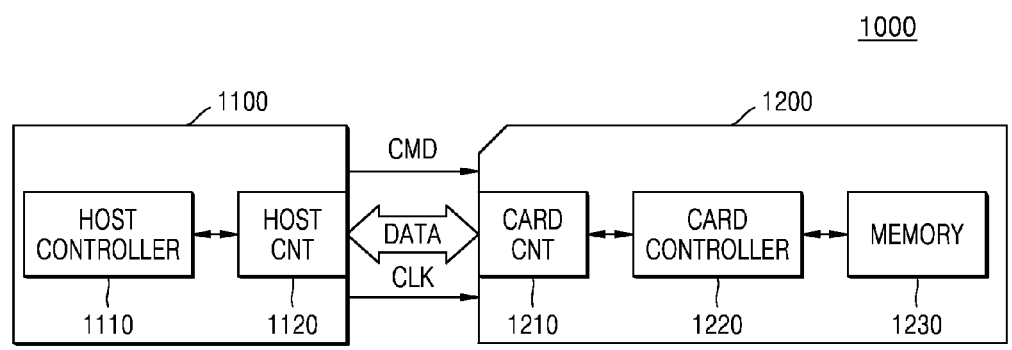
FIG. 20 is a block diagram of an example, in which the memory system according to the exemplary embodiments of the application is applied to a memory card system.

FIG. 20 is a block diagram of a memory card system 1000 having a memory system applied thereto, according to an embodiment of the application.

Referring to FIG. 20, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the embodiments shown in FIGS. 1 through 19. According to the one or more exemplary embodiments, the memory device 1230 applies inhibit voltages having different voltage levels from each other to unselected memory cells according to physical locations of the memory cells, and adjusts the number of inhibit voltages or the voltage differences between the inhibit voltages based on the amount of current flowing through the selected signal line to reduce the leakage current. In one exemplary embodiment, the card controller 1220 may control the memory device 1230 to adjust the number of inhibit voltages or the voltage differences between the inhibit voltages.

The host 1100 may write data in the memory card 1200 or read the data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be realized as a compact flash card (CFC), a micro drive, a smart media card (SMC), a multimedia card (MMC), a security digital card (SDC), a memory stick, or a USB flash memory.

Figure 21:
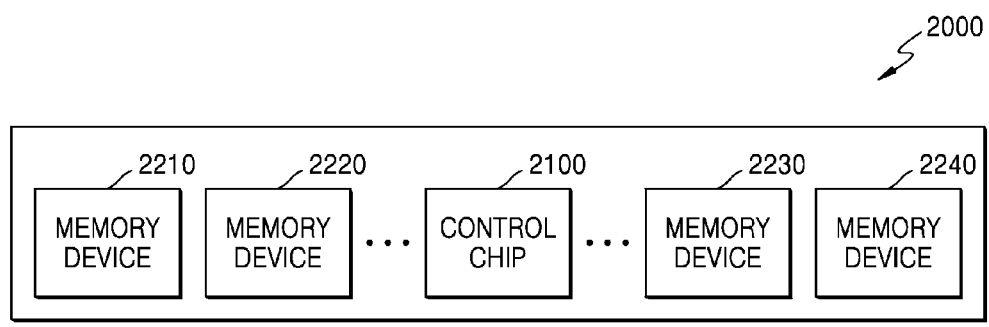
FIG. 21 is a diagram of a resistive memory module according to an exemplary embodiment of the application.

FIG. 21 is a block diagram of a resistive memory module 2000 according to an embodiment of the present application. Referring to FIG. 21, the resistive memory module 2000 may include memory devices 2210 through 2240, and a control chip 2100. Each of the memory devices 2210 through 2240 may be formed according to the embodiments illustrated in FIGS. 1 through 19. According to the one or more exemplary embodiments, each of the memory devices 2210 through 2240 applies inhibit voltages having different voltage levels from each other to unselected memory cells according to physical locations of the memory cells, and adjusts the number of inhibit voltages or the voltage differences between the inhibit voltages based on the amount of current flowing through the selected signal line to reduce the leakage current.

The control chip 2100 may control the memory devices 2210 through 2240 in response to various signals transmitted from an external memory controller. For example, the control chip 2100 activates the memory devices 2210 through 2240 corresponding to various commands and addresses transmitted from the outside in order to control writing and reading operations. Also, the control chip 2100 may perform post processes of the read data output from the memory devices 2210 through 2240, for example, error detection and correction operations of the read data. Also, the control chip 2100 may control the memory devices 2210 through 2240 to adjust the number of inhibit voltages or the voltage differences between the inhibit voltage generated by each of the memory devices 2210 through 2240.

Figure 22:
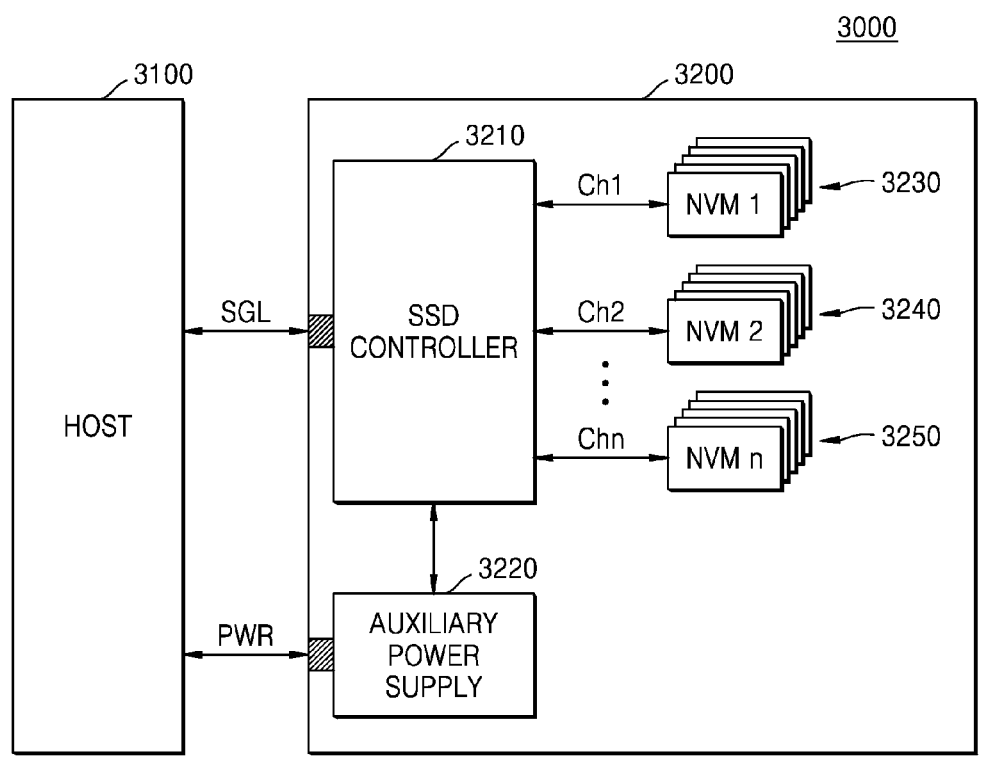
FIG. 22 is a block diagram of an SSD system to which the memory system according to the exemplary embodiments of the application is applied.

FIG. 22 is a block diagram of an example in which a memory system according to an embodiment of the present application is applied to an SSD system 3000.

Referring to FIG. 22, the SSD system 3000 may include a host 3100 and an SSD 3200. The SSD 3200 exchanges signals SGL with the host 3100 via a signal connector and receives a power input PWR from a power connector. The SSD 3200 may include an SSD controller 3210, an auxiliary power supply device 3220, and a plurality of memory devices 3230, 3240, and 3250. The SSD controller 3210 communicates with memory devices NVM1 3230, NVM2 3240, and NVMn 3250 through channels Ch1, Ch2, . . . , Chn. Here, the SSD 3200 may be realized according to the embodiments illustrated in FIGS. 1 through 22.

Figure 23:
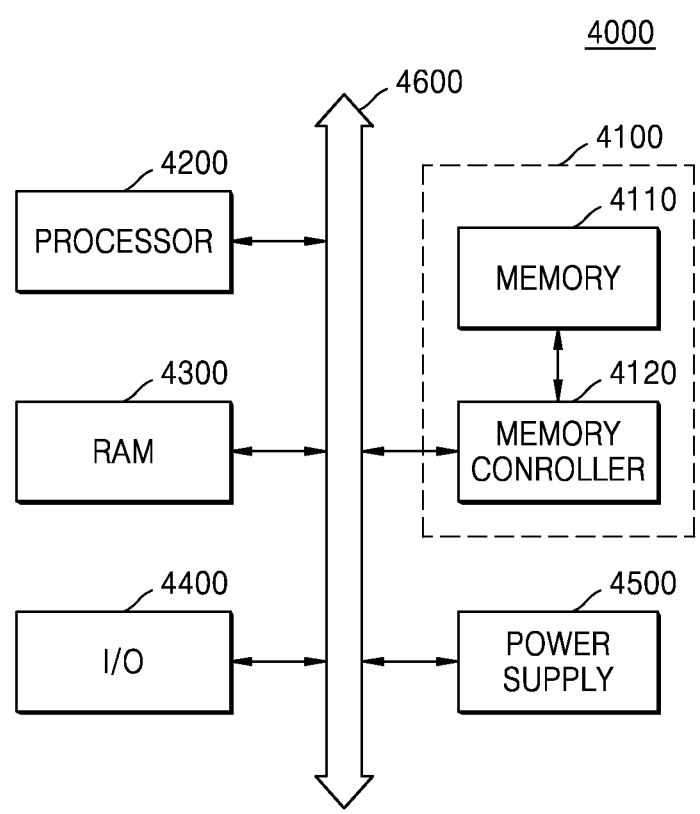
FIG. 23 is a block diagram of a computing system including the memory system according to the exemplary embodiments of the application.

FIG. 23 is a block diagram of a computing system 4000 including a memory system 4100, according to an embodiment of the present application.

Referring to FIG. 23, the computing system 4000 includes the memory system 4100, a processor 4200, RAM 4300, an input/output (I/O) device 4400, and a power supply 4500. Although not shown in FIG. 23, the computing system 4000 may further include ports capable of communicating with a video card, a sound card, a memory card, an USB device, or other electronic devices. The computing system 4000 may be embodied as a PC, or a portable electronic device such as a notebook computer, a mobile phone, a personal digital assistant (PDA), or a camera.

The processor 4200 may perform particular calculations or tasks. In one or more embodiments, the processor 4200 may be a micro-processor, a Central Processing Unit (CPU), or the like. The processor 4200 may perform communication with the RAM 4300, the I/O device 4400, and the memory system 4100 via a bus 4600 such as an address bus, a control bus, or a data bus. Here, the memory system 4100 includes a memory 4110 and memory controller 4120 and may be embodied by using the embodiments shown in FIGS. 1 through 22.

In one or more embodiments, the processor 4200 may also be connected to an extended bus such as a Peripheral Component Interconnect (PCI) bus.

The RAM 4300 may store data for operations of the computing system 4000. As described above, the memory device according to the one or more embodiments of the application may be applied to the RAM 4300. Alternatively, DRAM, mobile DRAM, SRAM, PRAM, FRAM, or MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the application has been particularly shown and described with reference to exemplary embodiments thereof, it will be understood that various changes in form and details may be made therein without departing from the spirit and scope of the following claims.

What is claimed is:

1. A method of operating a memory device comprising a plurality of memory cells arranged on regions where a plurality of first signal lines and a plurality of second signal lines cross each other, the method comprising:
   determining a value of an operating current flowing through a selected first signal line, to which a selection voltage is applied, from among the plurality of first signal lines;
   dividing a memory cell array comprising the plurality of memory cells into n blocks, n being an integer greater than 1, based on the value of the operating current; and
   applying inhibit voltages having different voltage levels corresponding to the n blocks to the unselected second signal lines included in the n blocks, wherein
   each of the unselected second signal lines is a pathway through which leakage current may potentially flow due to the operating current flowing through the selected first signal line and a memory cell addressed by the unselected second signal line and the selected first signal line.

2. The method of claim 1, wherein the dividing of the memory cell array into the n blocks comprises determining a value of n based on the value of the operating current.

3. The method of claim 2, wherein the dividing of the memory cell array into the n blocks is characterized by increasing the value of n when the value of the operating current increases.

4. The method of claim 1, further comprising:
   setting numbers of blocks, each number of blocks corresponding to a range of operating currents, wherein
   the dividing of the memory cell array into the n blocks comprises selecting the value of n from among the numbers of the blocks set in advance, based on the value of the operating current.

5. The method of claim 1, wherein the determining of the value of the operating current is based on the number of selected memory cells, from among the plurality of memory cells, connected to the selected first signal line when a writing operation is performed.

6. The method of claim 1, wherein the determining of the value of the operating current is based on the number of programming loops for which a pulse is applied to the selected first signal line when a writing operation is performed.

7. The method of claim 1, wherein the applying of the inhibit voltages comprises applying an inhibit voltage having a relatively high voltage level among the inhibit voltages to a block located relatively close to at least one point to which the selection voltage is applied, from among the n blocks.

8. The method of claim 1, wherein the applying of the inhibit voltages comprises setting the voltage differences between the inhibit voltages based on the value of the operating current.

9. The method of claim 1, wherein the selection voltage is one of a write voltage and a read voltage.

10. The method of claim 1, wherein:
the memory device comprises a plurality of tiles, each comprising some of the plurality of memory cells, and
the determining of the operating current and the dividing of the memory cell array into the n blocks are performed with respect to each of the plurality of tiles.

11. A method of operating a memory device comprising a plurality of memory cells arranged on regions where a plurality of first signal lines and a plurality of second signal lines cross each other, the method comprising:
determining a value of an operating current flowing through a selected first signal line, to which a selection voltage is applied, from among the plurality of first signal lines;
generating a plurality of inhibit voltages, wherein voltage differences between the plurality of inhibit voltages are adjusted based on the value of the operating current; and
applying the plurality of inhibit voltages to unselected second signal lines from among the plurality of second signal lines, wherein
each of the unselected second signal lines is a pathway through which leakage current may potentially flow due to the operating current flowing through the selected first signal line and a memory cell addressed by the unselected second signal line and the selected first signal line.

12. The method of claim 11, wherein the generating of the plurality of inhibit voltages comprises increasing the voltage differences between the plurality of inhibit voltages when the value of the operating current increases.

13. The method of claim 11, wherein the applying of the plurality of inhibit voltages comprises dividing the second signal lines into a plurality of groups according to distances from at least one point, to which the selection voltage is applied, on the selected first signal line, and applying an inhibit voltage having a relatively high voltage level to a group that is close to the at least one point from among the plurality of groups.

14. The method of claim 11, wherein the voltage differences between the plurality of inhibit voltages are constant.

15. The method of claim 11, wherein the determining of the operating current comprises determining the value of the operating current according to an operation mode of the memory device.

16. A method of operating a memory device comprising an array of memory cells that are addressed by a plurality of first and second signal lines, the method comprising:
dividing the array of memory cells into n blocks of memory cells based on an indicator of the amount of operating current to be applied to a selected one of the first signal lines; and
for each of the n blocks of memory cells, applying an inhibit voltage to each unselected one of the second signal lines addressing a memory cell within the block of memory cells, wherein:
a different inhibit voltage is applied to each of two or more of the n blocks of memory cells, and
each of the unselected second signal lines is a pathway through which leakage current may potentially flow due to the operating current flowing through the selected first signal line and a memory cell addressed by the unselected second signal line and the selected first signal line.

17. The method of claim 16, wherein:
the different inhibit voltages applied to each of the two or more blocks of memory cells are selected so as to reduce the difference between a leakage current flowing through a first memory cell of one of the two or more memory cell blocks and a leakage current flowing through a second memory cell of another of the two or more memory cell blocks,
the first memory cell is addressed by the selected first signal line and an unselected second signal line to which a first inhibit voltage is applied for the one memory cell block, and
the second memory cell is addressed by the selected first signal line and an unselected second signal line to which a second inhibit voltage is applied for the other memory cell block.

18. The method of claim 16, wherein:
the different inhibit voltages applied to the two or more blocks of memory cells are selected based on a first voltage expected to be applied by the selected first signal line to a first memory cell of one of the two or more memory cell blocks and a second voltage expected to be applied by the selected first signal line to a second memory cell of another of the two or more memory cell blocks,
the first memory cell is addressed by the selected first signal line and an unselected second signal line to which a first inhibit voltage is applied for the one memory cell block, and
the second memory cell is addressed by the selected first signal line and an unselected second signal line to which a second inhibit voltage is applied for the other memory cell block.

19. A memory device comprising:
an array of memory cells addressed by a plurality of first signal lines and a plurality of second signal lines, each of the memory cells being addressed by one of the first signal lines and one of the second signal lines;
control logic that divides the array of memory cells into n blocks of memory cells based on an indicator of the amount of operating current to be applied to a selected one of the first signal lines;
a first switch block that applies the operating current to the selected first signal line;
a second switch block that, for each of the n blocks of memory cells, applies an inhibit voltage to each unselected ones of the second signal lines addressing a memory cell within the block of memory cells, wherein:
a different inhibit voltage is applied to each of two or more of the n blocks of memory cells, and
each of the unselected second signal lines is a pathway through which leakage current may potentially flow due to the operating current flowing through the selected first signal line and a memory cell addressed by the unselected second signal line and the selected first signal line.

20. The memory device of claim 19, wherein:
the different inhibit voltages applied to each of the two or more blocks of memory cells are selected so as to reduce the difference between a leakage current flowing through a first memory cell of one of the two or more memory cell blocks and a leakage current flowing through a second memory cell of another of the two or more memory cell blocks,
the first memory cell is addressed by the selected first signal line and an unselected second signal line to which a first inhibit voltage is applied for the one memory cell block, and
the second memory cell is addressed by the selected first signal line and an unselected second signal line to which a second inhibit voltage is applied for the other memory cell block.

* * * * *